United States Patent
Sahara et al.

(10) Patent No.: US 7,310,266 B2
(45) Date of Patent: Dec. 18, 2007

(54) SEMICONDUCTOR DEVICE HAVING MEMORY CELLS IMPLEMENTED WITH BIPOLAR-TRANSISTOR-ANTIFUSES OPERATING IN A FIRST AND SECOND MODE

(75) Inventors: Ryusuke Sahara, Ome (JP); Mitsugu Kusunoki, Kunitachi (JP); Kazutaka Mori, Kokubunji (JP); Hiroshige Kogayu, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/409,963

(22) Filed: Apr. 25, 2006

(65) Prior Publication Data

US 2006/0245266 A1    Nov. 2, 2006

(30) Foreign Application Priority Data

Apr. 27, 2005    (JP) .............................. 2005-128857

(51) Int. Cl.
  *G11C 11/40* (2006.01)
  *H03M 1/66* (2006.01)

(52) U.S. Cl. .................. 365/177; 365/175; 365/174; 365/96; 365/104; 365/105; 365/156; 365/230.03; 365/225.7; 341/144; 341/121; 341/120

(58) Field of Classification Search ................ 365/177, 365/175, 181, 174, 230.03, 225.7, 96, 104, 365/105, 156, 154; 341/144, 51, 121, 120; 714/727, 726
See application file for complete search history.

(56) References Cited

U.S. PATENT DOCUMENTS

| | | | | |
|---|---|---|---|---|
| 3,898,483 A | * | 8/1975 | Sander et al. | 365/181 |
| 3,949,243 A | * | 4/1976 | Sander et al. | 365/186 |
| 4,866,674 A | * | 9/1989 | Tran | 365/189.11 |
| 5,426,526 A | * | 6/1995 | Yamamoto et al. | 349/42 |
| 5,581,508 A | * | 12/1996 | Sasaki et al. | 365/200 |
| 5,966,324 A | * | 10/1999 | Wada et al. | 365/177 |
| 6,107,659 A | * | 8/2000 | Onakado et al. | 257/318 |
| 6,225,933 B1 | * | 5/2001 | Salter et al. | 341/144 |
| 6,989,580 B2 | * | 1/2006 | Pellizzer et al. | 257/577 |
| 7,071,533 B1 | * | 7/2006 | Kimber et al. | 257/529 |
| 2006/0049392 A1 | * | 3/2006 | Pellizzer et al. | 257/5 |

FOREIGN PATENT DOCUMENTS

| | | |
|---|---|---|
| JP | 7-141041 | 6/1995 |
| JP | 11-339205 | 12/1999 |
| JP | 2000-48591 | 2/2000 |
| JP | 2002-231887 | 8/2002 |
| JP | 2002-319300 | 10/2002 |
| JP | 2006-311001 | * 11/2006 |

* cited by examiner

*Primary Examiner*—Andrew Q. Tran
(74) *Attorney, Agent, or Firm*—Miles & Stockbridge P.C.

(57) ABSTRACT

A DAC having a memory mat including a plurality of first memory cells, and a plurality of output lines connected to the plurality of first memory cells. Each of the plurality of memory cells has a first memory portion including bipolar transistors and storing information in non-volatility based on whether a junction of the bipolar transistors is destroyed or not, and a second memory portion connected to the first memory portion and for outputting information to corresponding one of the plurality of output lines. The DAC has a first mode in which information is transferred from the first memory portions to the second memory portions when the information is written into the second memory portions, and a second mode in which the second memory portions are specified externally and information is written into the second memory portions.

9 Claims, 20 Drawing Sheets

US 7,310,266 B2

SEMICONDUCTOR DEVICE HAVING MEMORY CELLS IMPLEMENTED WITH BIPOLAR-TRANSISTOR-ANTIFUSES OPERATING IN A FIRST AND SECOND MODE

CLAIM OF PRIORITY

The present application claims priority from Japanese application JP2005-128857 filed on Apr. 27, 2005, the content of which is hereby incorporated by reference into this application.

FIELD OF THE INVENTION

The present invention relates to a semiconductor device, and particularly relates to a semiconductor integrated circuit mounted with a digital-analog converter (D/A converter).

BACKGROUND OF THE INVENTION

In a product such as a D/A converter required to have a high output voltage accuracy, there is a manufacturing variation in various devices such as resistors, transistors, etc. Due to the variation, it is very difficult for the manufactured product to attain the required accuracy as it is. It is therefore essential to feed back the properties measured after manufacturing, and to perform some kind of trimming on the manufactured product. Further, when the variation varies in accordance with data bit settings, the trimming range must be changed for each data bit. It is therefore effective to use a PROM having a mat configuration. Examples of fuses forming such PROMs include aluminum fuses that can be cut from the outside by a laser, polysilicon fuses that can be electrically cut or broken, anti-fuses using bipolar transistors, etc. It is, however, likely that the properties may change due to influence of heating or stress caused by packaging. It is therefore effective to use an electric fuse that can be cut or broken after packaging.

FIG. 18 shows a configuration view of an anti-fuse PROM using diodes. Description will be made about the write operation of the anti-fuse PROM using diodes. When a high voltage is applied between a word line PW and a data line PD, a reverse bias is applied to a diode transistor D1 so that a large current flows therein. As a result, the diode transistor D1 is destroyed and brought into a low resistance state, in which a low resistance connection is established between a node VM and the word line PW. This is the state of writing into the PROM. Next, description will be made about the read operation. The word line PW is set at high level, and the data line PD is connected to low level through a high resistance. In this event, when the PROM is not destroyed, the diode transistor D1 acts as a reverse bias diode so that the data line PD is brought into low level. On the other hand, when the PROM is destroyed, the voltage level of the data line PD is one-diode lower than the voltage level of the word line PW due to a diode transistor D2 because the diode transistor D1 has a low resistance.

With the advance of fine processing, it was found that when a large current was applied to the diode transistor D1 in order to destroy the diode transistor D1 in the diode type anti-fuse PROM used in the background art, the diode transistor D2 which was intended not to be destroyed was also destroyed. Prior to the present invention, the present inventor made a study of an anti-fuse PROM using bipolar transistors as shown in FIG. 19. Here, description will be made about the write operation of the PROM using bipolar transistors. When a high voltage is applied between a word line PW and a data line PD, a reverse bias is applied between the emitter and the collector of a bipolar transistor Q2 so that a large current flows therein. As a result, the emitter-base junction is destroyed and brought into a low resistance state, in which a low resistance connection is established between a node VM and the data line PD. This is the state of writing into the PROM. Next, description will be made about the read operation. The word line PW is set at high level, and the data line PD is connected to low level through a high resistance. In this event, when the PROM is not destroyed, the bipolar transistor Q2 acts as a reverse bias diode so that the data line PD is brought into low level. On the other hand, when the PROM is destroyed, the voltage level of the data line PD is lower than the voltage level of the word line PW by Vbe due to the diode connection of a bipolar transistor Q1 because the bipolar transistor Q2 has a low resistance.

The PROM having an anti-fuse configuration using bipolar transistors as described above has the following problems. First, there is a problem that a through current flows between the word line PW and the data line PD in the destroyed PROM portion whenever data are read. The larger the number of destroyed PROMs is, the larger the number of through currents is. If the number of PROMs reaches several thousands or several tens of thousands, the problem will be fatal. In this PROM configuration, the data line level in the destroyed PROM is lower than the high level by the voltage Vbe of the bipolar transistor Q2. Accordingly, if this level is received by the gate of a CMOS transistor as it is, a through current will flow into the reception-side CMOS transistor circuit. Thus, the power consumption will increase, or the normal operation will be prevented.

Further, when trimming is performed in an LSI using PROMs configured thus, first, measuring is performed with a tester or the like, and writing into the PROMs is performed based on the obtained information. However, as a result of writing into the PROMs, correction may be insufficient, or overcorrection may have been performed. In this case, improvement may be expected by rewriting, but written information cannot be restored. It may be therefore impossible to perform further correction on the LSI.

SUMMARY OF THE INVENTION

Principal configurations of the present invention are disclosed herein as:

a semiconductor device including a memory mat including a plurality of first memory cells, and a plurality of output lines connected to the plurality of first memory cells, wherein each of the plurality of memory cells has a first memory portion including bipolar transistors and storing information in non-volatility based on whether a junction of the bipolar transistors is destroyed or not, and a second memory portion connected to the first memory portion and for outputting information to corresponding one of the plurality of output lines, and the semiconductor device has a first mode in which information is transferred from the first memory portions to the second memory portions when the information is written into the second memory portions, and a second mode in which the second memory portions are specified externally and information is written into the second memory portions.

Preferably, each of the plurality of memory cells further includes a first transfer gate provided between the first memory portion and the second memory portion, and the first transfer gate transfers information stored in the first memory portion, to the second memory portion when a reset signal is input to the semiconductor device.

Preferably, the semiconductor device further includes a plurality of flip-flops provided correspondingly to the plurality of output lines, and a plurality of second transfer gates provided between the plurality of output lines and the plurality of flip-flops respectively, wherein the plurality of flip-flops form a scan chain, and the semiconductor device transfers data to the plurality of flip-flops sequentially in the second mode, and then selects the second transfer gates so as to transfer information to the second memory portions corresponding thereto.

Thus, the performance of t he semiconductor device can be improved.

DETAILED DESCRIPTION OF THE INVENTION

Figure 1:
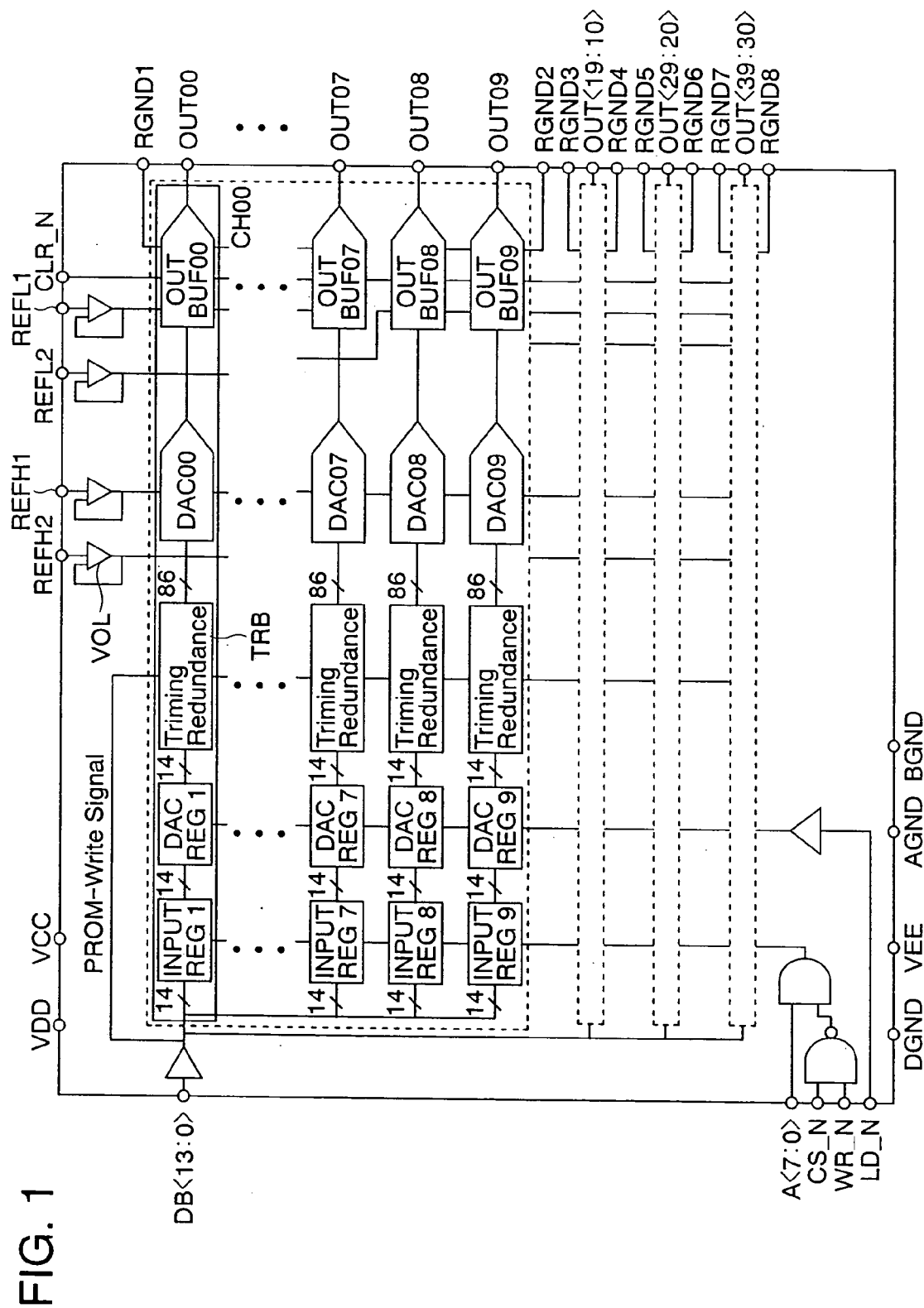
FIG. 1 is a general block diagram of an LSI to which the present invention is applied.

FIG. 1 shows a block diagram of an embodiment of a D/A converter circuit as an example of a semiconductor integrated circuit device to which the present invention has been applied. With reference to FIG. 1, description will be made first about the outline of the configuration and operation of the D/A converter according to this embodiment. In the D/A converter according to this embodiment, forty 14-bit channels are implemented by one chip. A data bit input DB<13:0> serving as a 14-bit input pin and outputs OUT<39:00> serving as 40-channel output pins are provided. In this embodiment, the 40 channels are divided in units of 10 channels in terms of the circuitry and the layout. For example, circuits that do not have to be provided for each channel, such as AGND correction circuits, offset correction circuits, internal power generation circuits, etc., which will be described later, are provided in units of 10 channels so that the area of the D/A converter can be reduced. Each data input portion has a buffer with a two-stage configuration of an input register INPUTREG ( is 00-39, designating the channel number. The same thing will be applied to the following cases.) and a DAC register DACREG**.

Channels are selected by an address input A<7:0>, and data bits in the data bit input DB<13:0> are input. When a clock pulse signal is applied to a chip select CS_N and an input clock WR_N in this state, data can be fetched into the input register INPUTREG of each selected channel. In this event, when a load DAC signal LD_N is set at low level, the output data of the aforementioned input register INPUTREG are fetched in the DAC register DACREG. As a result, the output data of the DAC register DACREG go through a redundance trimming portion TRB, a D/A conversion portion DAC and an output buffer portion OUTBUF. Thus, the 14-bit digital input is converted into an analog voltage, which is output to OUT as an output voltage. With this configuration, the load DAC signal LD_N is set at high level while data are input to input registers INPUTREG of a plurality of channels. When the load DAC signal LD_N is then switched to low level, outputs of the plurality of channels can be updated concurrently. The reference sign VDD designates a digital power supply; VCC and VEE, positive and negative analog power supplies respectively; AGND and BGND, analog grounds; and DGND, a digital ground. The reference signals REFH1, REFH2, REFL1 and REFL2 designate reference voltage inputs for determining a maximum value and a minimum value of output voltages. The reference voltage inputs REFH1, REFH2, REFL1 and REFL2 are supplied from input pins to the inside through voltage follower circuits VOL using operational amplifiers respectively, and distributed to each channel. If resistors are connected directly to each reference voltage input pin, the input current to the pin will increase in accordance with increase of the number of channels connected thereto.

Therefore, buffering is performed by the voltage follower circuits VOL so that only differential input currents of the operational amplifiers serve as the input currents to the pins respectively. Thus, the input currents are reduced largely, and prevented from depending on the number of connected channels. Particularly each D/A converter often has a plurality of channels. It is effective to use such a voltage follower circuit for the D/A converter. RGND1-8 designate pins for providing offset voltages to the channel outputs respectively. These inputs are also designed to be buffered by voltage follower circuits in the same manner as the reference voltage inputs REFH1-2 and REFL1-2.

Figure 2:
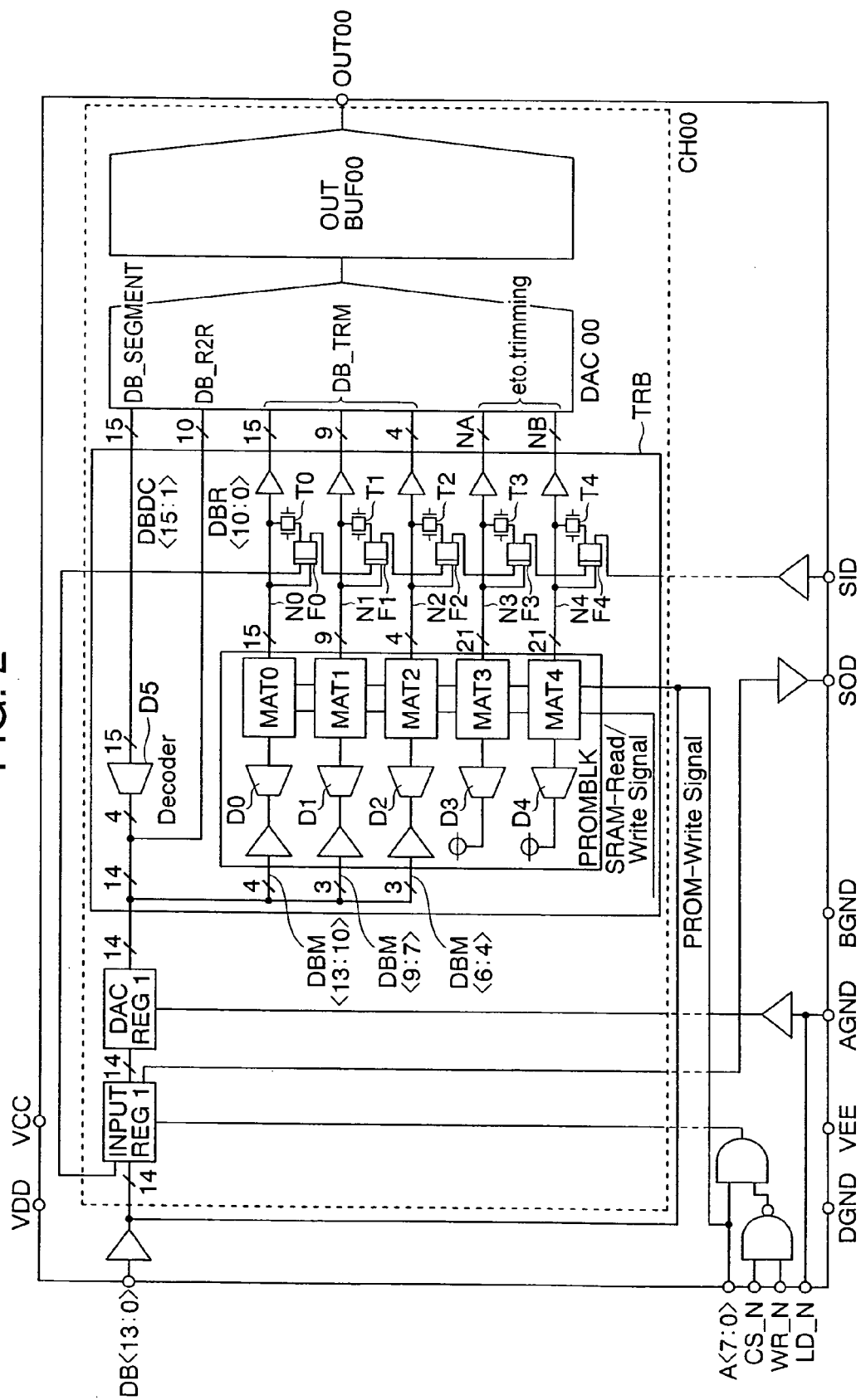
FIG. 2 is a block diagram particularly showing one channel in FIG. 1 in detail.

FIG. 2 is a block diagram showing one channel of the general block diagram of FIG. 1 especially in detail. The other channels also have the same configurations. The reference sign CH00 in FIG. 1 and the reference sign CH00 in FIG. 2 designate one and the same block. In the redundance trimming portion TRB, the output of the DAC register DACREG1 is distributed to the side for supplying a data bit signal as it is and the side for supplying a trimming data signal. Of 14 bits of the former signal, the upper 4 bits are decoded in a decoder D5, and input to the D/A conversion portion DAC00 as 15 signals of DBDC<15:1>. The lower 10 bits are input directly to DAC00 as DBR<10:0>. On the other hand, the latter signal distributed for providing trimming data is input to a PROM block PROMBLK, decoded in decoders D0, D1 and D2 through buffers, and input to PROM mats MAT0, MAT1 and MAT2. As will be described later, decoders D3 and D4 are provided also in MAT3 and MAT4 to which the trimming data signal is not distributed, in order to control a reset signal.

PROM memory cells are disposed inside each of these PROM mats in the form of an array. Each PROM memory cell is mounted with a PROM portion for destroying a fuse and writing information, and an SRAM portion for holding data. Thus, when trimming is initiated, data are written not into the PROM portion but into the SRAM portion so that pseudo trimming can be performed. In addition, information in the PROM portion is transferred to the SRAM portion as soon as the power is turned on. Thus, the power consumption can be reduced. The specific configuration of the memory cells will be described in detail later.

First, description will be made about normal operation for performing D/A conversion based on data input to the data bit input DB. Trimming information written into each PROM memory cell in each PROM mat is transferred from the PROM portion to the SRAM portion before the normal operation is started. The PROM block PROMBLK selects SRAM portions of PROM memory cells in the PROM block PROMBLK corresponding to addresses set by data of input DB<13:10>, DB<9:7> and DB<6:4> respectively. Trimming data to be stored are output from MAT0-2 to signal lines N0-N2. The signals of the signal lines N0-N2 are input to DB_TRM of DAC00 through buffers. An output value corrected by the total sum of data input to DB_TRM in addition to DB_SEGMENT and DB_R2R of DAC00 is output to the output OUT00 via an output buffer OUTBUF00. In the same manner, trimming information is also written into PROM memory cells of the PROM mats MAT3 and MART4, and trimming data independent of the data bit input DB<13:0> are output to signal lines N3 and N4 respectively. Of the signal lines N3 and N4, NA lines and NB lines are input to DAC00 as trimming signals through buffers respectively. Parts of MAT3 and MAT4 are used as trimming data for a portion other than DAC00, for example, for a portion shared by the LSI as a whole. Flip-flops F0-F4 and transfer gates T0-T4 are connected to the signal lines N0-N4 respectively. In the normal operation, the transfer gates T0-T4 are OFF, having no influence on the outputs of the PROM mats.

Next, description will be made about the operation for performing pseudo trimming using the SRAM. Once data are written into the PROM portion of each PROM memory cell, the data cannot be changed. Pseudo trimming is therefore performed for determining data to be actually written into the PROM portion by use of the rewritable SRAM portion before the data are actually written into the PROM portion. The flip-flops F4, F3, F2, F1 and F0 and the input register INPUTREG1 constitute scan chains, in which data input from a scan data input SID can be written into the flip-flops respectively. Here, the flip-flops F0-F4 form the scan chains individually, but they are illustrated for brevity. For example, F0 forms a scan chain out of 15 flip-flops, and F1 forms a scan chain out of 9 flip-flops. Such a scan chain is formed for each channel so that not only scanning-in with all the channels as a single line but also scanning-in with only selected channels can be performed. The reason why such a scan chain configuration is made is to make it possible to reduce the number of data input terminals due to the scan chains and to thereby make it unnecessary to provide another terminal for pseudo trimming.

First, data to be set in the flip-flops F0-F4 and the input register INPUTREG1 are written by scanning-in. In this event, channels and mats can be selected by existing input pins, for example, by parts of the address input A<7:0> and the data bit input DB<13:0>. When the transfer gates T0-T4 are turned on in this event, the scanned-in data of the flip-flops F0-F4 are output to the signal lines N0-N4 respectively, and dealt with as data line signals for writing on the SRAMs. When an SRAM write clock signal is input in this state, data are written into the SRAMs in the PROM memory cells of the PROM mates MAT0-4 addressed by the scanned-in data in the input register INPUTREG1. To read written information, the transfer gates T0-T4 are turned off, and the SRAM outputs are supplied to the signal lines N0-N4 and input to DAC00 as SRAM-read data line signals. The SRAM write and read operations are repeated to perform pseudo trimming.

Next, description will be made about the PROM-write operation. Any PROM portion must be destroyed by a large current applied to a bipolar transistor at the time of writing. Therefore, the driver size becomes very large. To solve this problem, each PROM memory cell constituted by a PROM portion and an SRAM portion has not a mat configuration similar to that of the SRAM but a configuration that one and the same driver is shared among a plurality of channels. Thus, the area of the PROM memory cell is reduced. This configuration will be described in detail later. Writing in the PROM is achieved by an externally input signal based on write information obtained by the pseudo trimming on the SRAM. A PROM data line driver and a PROM word line driver are selected by a PROM data line selection signal DP<7:0> and a PROM word line selection signal WP<5:0>. A PROM data line driver driving signal DRP_N and a PROM word line driver driving signal WRP_N are brought into low level together. Thus, a large current is applied to the bipolar transistor of the selected PROM so that the fuse is destroyed, that is, writing into the PROM is performed. All the addressing inputs and the write clock signal inputs used in this event are carried out using existing pins. Due to this specification, writing can be performed without adding any other pins.

Figure 3:
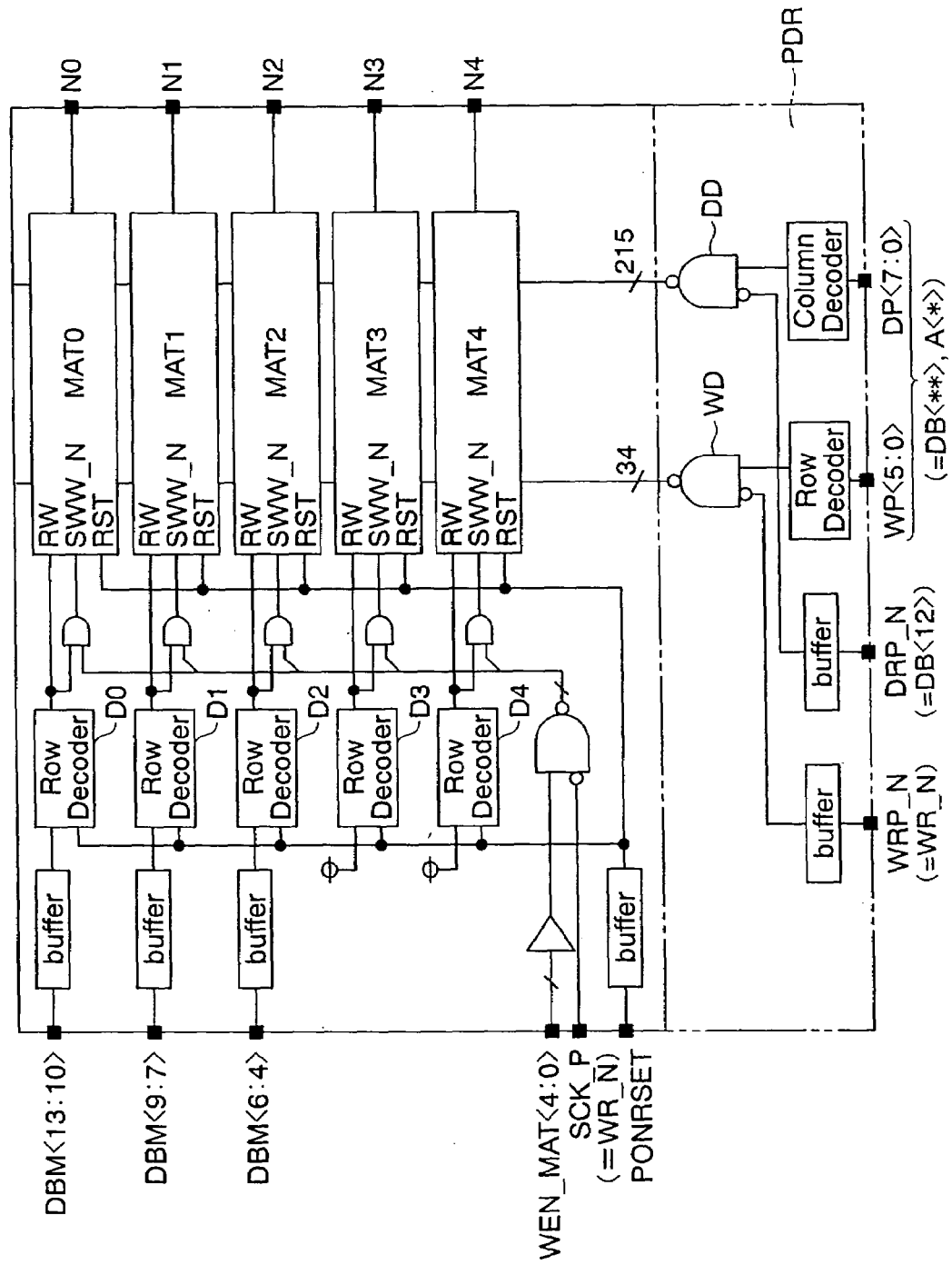
FIG. 3 is a block diagram showing a PROM block in FIG. 2 in detail.

FIG. 3 is a block diagram showing especially the PROM block PROMBLK of FIG. 2. WEN_MAT<4:0> is an SRAM write enable signal for each mat. SCK_P is a clock input. PONRSET is a power-on reset signal input. A pulse signal is input to this input whenever the power of the LSI is turned on. The information written in all the PROMs on the LSI are written into the corresponding SRAMs by this signal. The effect of this mechanism will be described in detail later. The power-on reset signal PONRSET is input to all the decoders D0-D4 through a buffer. When the power-on reset signal PONRSET is brought into high level, all the inputs RW of the PROM mats MAT0-4 are brought into low level so that the SRAM portions of the PROM mats MAT0-4 are separated from the output signals N0-N4 by the transfer gates. Particularly the decoders D3 and D4 do not have a function of specifying an address, but play only this role. WRP_N and DRP_N are PROM-write signals, and WP<5:0> and DP<7:0> are PROM word line and data line selection signals. WD and DD are PROM-write word and data drivers respectively. As described previously, each PROM driver portion PDR including these drivers is assigned to not one channel but a set of channels.

Figure 4:
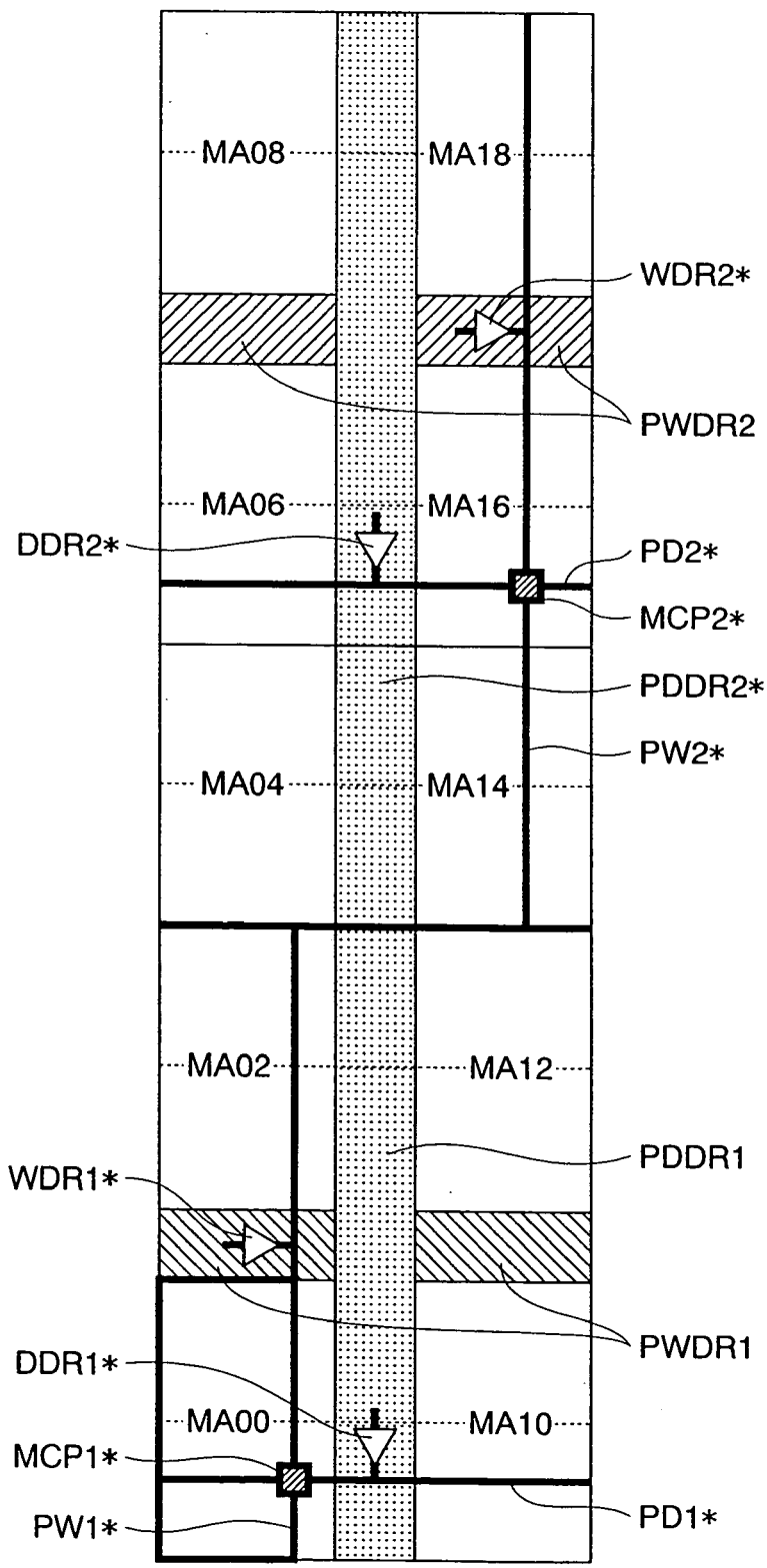
FIG. 4 is a configuration diagram of 20 channels of PROM memory mats.

FIG. 4 shows a PROM memory mat configuration diagram of 20 channels. Here, MA ( is an even number 00-18) designates a two-channel PROM memory mat. For example, MA00 is a memory mat for a channel 00 and a channel 01, and MA02 is a memory mat for a channel 02 and a channel 03. Data line drivers and word line drivers for PROM memory cells of 8 channels of the PROM memory mats MA00, MA02, MA10 and MA12 are disposed in a PROM data line driver region PDDR1 and a PROM word line driver region PWDR1 respectively. For example, when PROM data lines PD1* and PROM word lines PW1* are selected in a PROM write mode, PROMs in the memory cells MCP1* are selected, and a large current is applied thereto from the data line drivers DDR1* and the word line drivers WDR1*. Thus, the PROMs are destroyed. As for the other 12 channels of the 20 channels, in the same manner, the PROMs are destroyed by drivers disposed in a PROM data line driver region PDDR2 and a PROM word line driver region PWDR2. Since PROMs using bipolar transistors require a large current, transistors larger than transistors (for example, transistors constituting SRAM memory cells) used in any other circuit are required for the drivers WDR and DDR for driving the word lines PW and the data lines DD. Therefore, each word driver WDR and each data line driver DDR are designed to be shared among a plurality of channels so that the area can be reduced.

Figure 5:
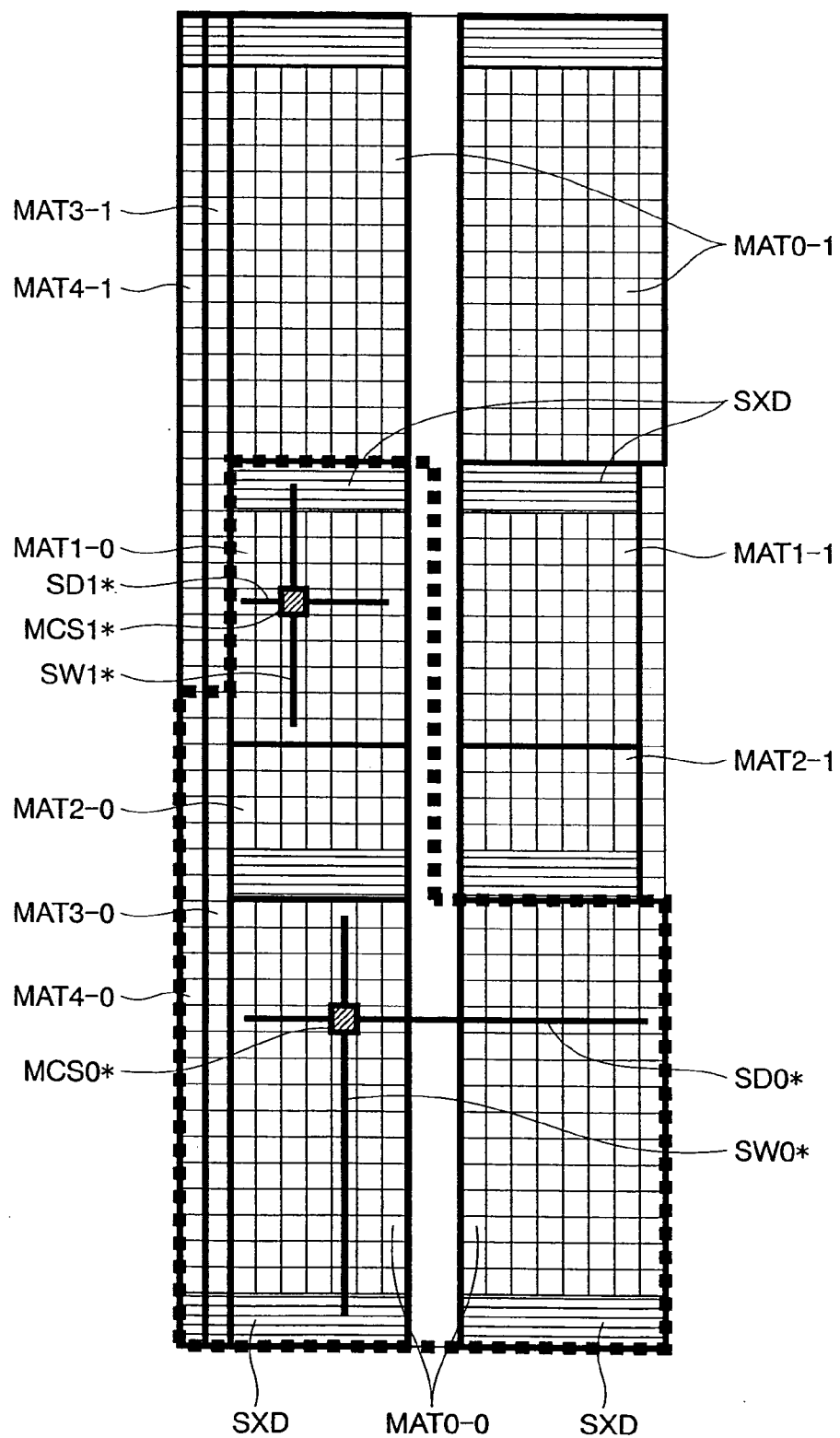
FIG. 5 is a diagram showing two channels of PROM memory mats in detail.

FIG. 5 is a detailed diagram showing the 2-channel memory mat MA00 of the 20-channel PROM memory mat configuration diagram of FIG. 4. A PROM memory mat MAT0-0 is a mat MAT0 for the channel 00, and MAT0-1 is a mat MAT0 for the channel 01. That is, the portion surrounded by the dotted line corresponds to the memory mat for the channel 00, and the other portion corresponds to the memory mat for the channel 01. Mats MAT0-4 shown in FIG. 5 correspond to the mats MAT0-4 shown in FIGS. 2 and 3 respectively. As described previously, a driver shared among a plurality of channels is used for the PROM portions in the PROM memory cells. On the other hand, as for the SRAM portions in the PROM memory cells, a combination of data lines and word lines is assigned to each memory mat MAT0-4. For example, when SRAM data lines SD0* and SRAM word lines SW0* are selected in the MAT0-0, SRAMs in the memory cells MCS0* are selected, and a write or read operation is carried out thereon. The other mats have similar configurations. When the SRAM portions are designed to have a combination of word lines and data lines assigned to each mat in such a manner, each memory mat can output data in parallel. It is therefore unnecessary to store trimming data in PROM memory cells for each different input data <13:0>. For example, assume that two pieces of input data <13:0> are identical as to <13:10> and different as to <9:7>. In this case, MAT0 can share trimming data between the two pieces of input data <13:0> so that the area can be reduced.

As described above, a driver shared among channels is provided for the PROM portions requiring a large current, and a driver is provided for the SRAM portions in each memory mat. Thus, the area can be reduced. The individual PROM portions in the plurality of channels sharing the driver cannot be selected in parallel. However, information stored in the PROM portions has been transferred to the SRAM portions in normal operation. Therefore, there is no problem.

Figure 6:
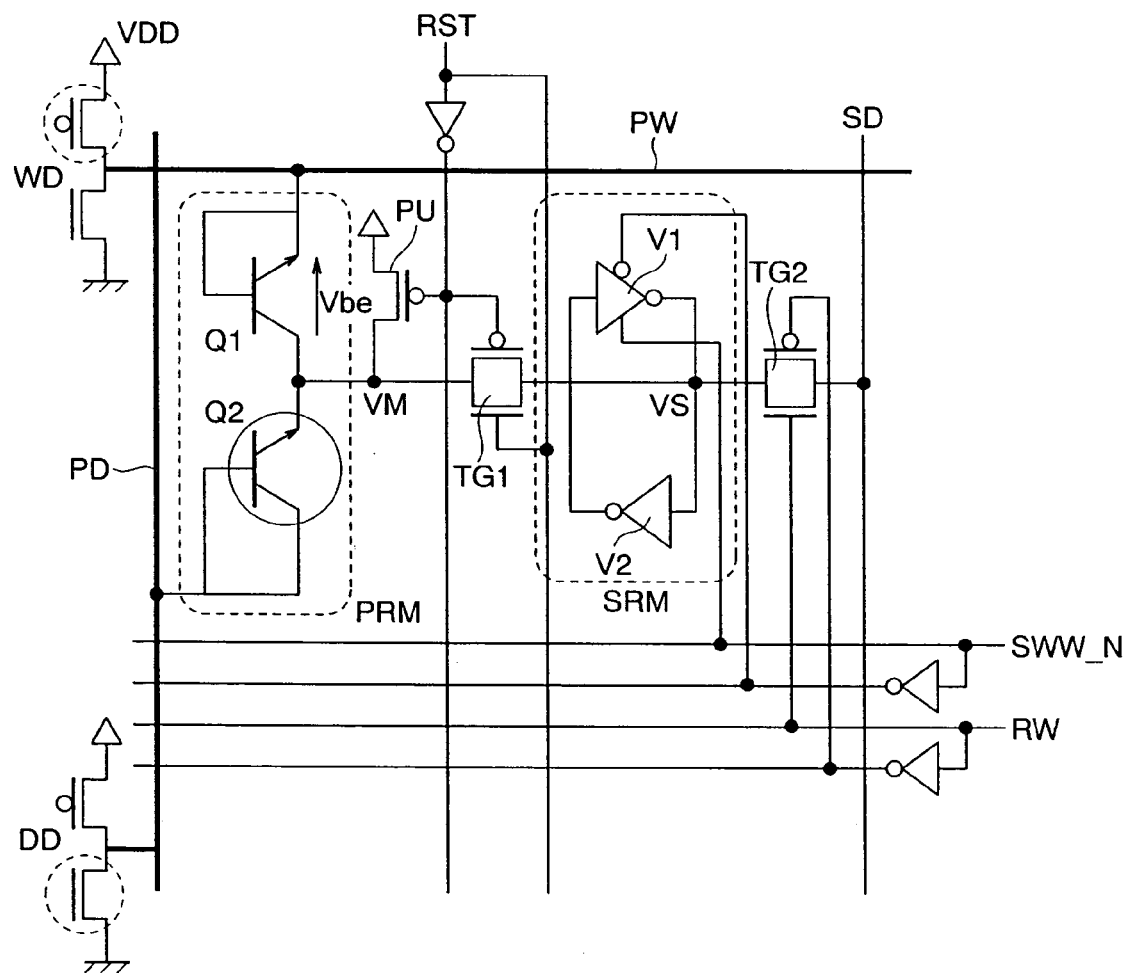
FIG. 6 is a configuration diagram of a PROM memory cell.

FIG. 6 is a configuration diagram of a PROM memory cell. The portion designated by PRM is an anti-fuse type PROM portion using bipolar transistors, having a configuration in which NPN bipolar transistors Q1 and Q2 are connected in two stages. Here, the bipolar transistor Q2 is destructive. The base and emitter of Q1 are connected to the PROM word line PW, and the base and collector of Q2 are connected to the PROM data line PD. The node where the collector of Q1 and the emitter of Q2 are connected is designated by VM.

Figure 19:
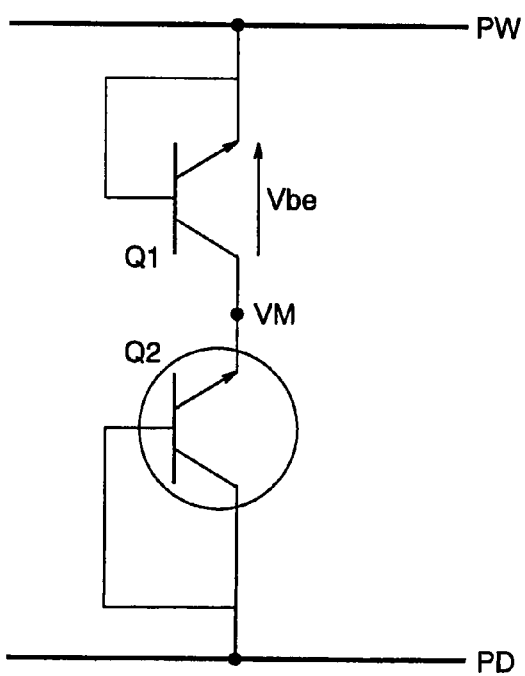
FIG. 19 is a configuration diagram of a background-art anti-fuse using bipolar transistors.

As shown in "BACKGROUND OF THE INVENTION", there arise various problems in the configuration using only an anti-fuse type PROM using bipolar transistors as shown in FIG. 19. Therefore, an SRAM portion together with a PROM portion is provided in this PROM memory cell so as to solve these problems. This effect will be described below.

First, the PROM write operation will be described. Initially, the power supply voltage VDD is increased to a voltage high enough to destroy the PROM. When the PROM word line driver WD and the PROM data line driver DD respectively connected to the PROM word line PW connected to the PROM portion PRM and the PROM data line PD are turned on in this state, a high voltage of reverse bias is applied between the emitter and collector of the bipolar transistor Q2. As a result, a large current flows between the emitter and collector of Q2 so that Q2 is destroyed. Thus, a low resistance state is established between the emitter and the base. This is the PROM write state.

In this PROM memory cell configuration, a PMOS transistor PU and a transfer gate TG1 are connected to the node VM, and an SRAM portion SRM is connected subsequently thereto. This SRAM portion SRM has a function of "fetching and holding information written in PROM" and a function of "fetching and holding pseudo trimming information" independent of the information written in the PROM and based on an internal write operation.

Description will be made below about the operation of "fetching and holding information written in PROM". When an external reset signal is turned on, a reset signal RST is brought into high level, and an SRAM read signal RW and an SRAW write signal SWW_N are brought into low level, so that the transfer gate TG1 and the PMOS transistor PU are turned on, and a transfer gate TG2 and a tristate inverter V1 are turned off. At the same time, the PROM data line PD is brought into low level. In this event, when the PROM is not destroyed, the bipolar transistor Q2 acts as a diode so that the node VM is brought into high level. Thus, a node VS is also brought into high level. When the external reset signal is turned off, the transfer gate TG1 is turned off, and the transfer gate TG2 and the tristate inverter V1 are turned on. Thus, high level is held in the SRAM portion SRM.

Assume that the PROM is destroyed when a reset pulse signal is input in the same manner. In this case, Q2 has a low resistance, which is lower than the on-resistance of the PMOS transistor PU. Thus, the node VM and the node VS are brought into low level so that the low level is held in the node VS of the SRAM portion SRM.

In an event other than the reset operation, the word line PW and the data line PD of the PROM portion are made open, so that there occurs no current consumption in the PROM portion. Accordingly, if this reset operation is performed all over the PROM memory cells once, information written in the PROM portions of all the PROM memory cells can be fetched and held in the SRAM portions. Thus, it is not necessary to operate the PROM portions. There is a great effect on reduction of power consumption. In addition, in the background-art PROM cell configuration shown in FIG. 19, the data line level is lower than the high level by a voltage drop corresponding to one diode.

In the memory cell configuration of the present invention, however, the data line voltage of the PROM is not output directly, but the voltage held in the node VS of the SRAM portion is output to the SRAM data line SD through the transfer gate TG2 so as to serve as a voltage to be input to a CMOS gate in a subsequent stage. Accordingly, the influence of the voltage drop caused by the diode can be eliminated perfectly. Also when data are transferred from the PROM portion to the SRAM portion, there occurs a voltage drop in Vbe due to a voltage supply to the node VM through the bipolar transistor Q1. However, such a voltage drop can be avoided by the voltage supply to the node VM through the PMOS transistor PU. Thus, it is possible to transfer data to the SRAM portion surely even in a low voltage operation.

In the LSI according to the embodiment, a reset pulse signal has to be input when the power supply is turned on. The LSI is mounted with a mechanism by which data written in all the PROMs are held in the SRAM portions based on the reset pulse signal as soon as the power supply is turned on. A circuit for detecting the power-on and generating a reset pulse may be provided. In this case, the reset operation (for example, transferring data written in all the PROMs to the SRAM portions) can be performed even if the external reset signal is not input.

Figure 7:
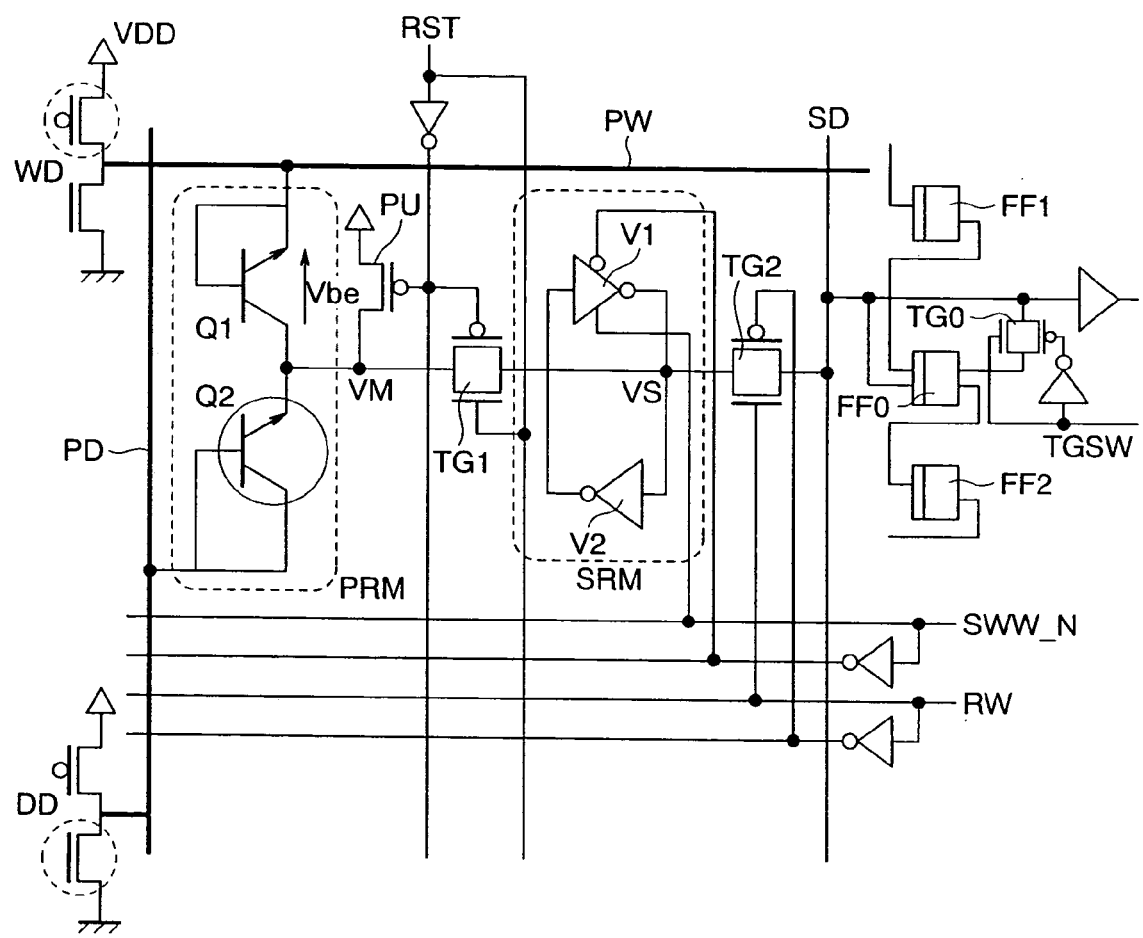
FIG. 7 is a configuration diagram of the PROM memory cell in FIG. 6 and a flip-flop circuit connected to the output thereof.

Next, description will be made about the operation of "fetching and holding pseudo trimming information" based on an internal write operation. FIG. 7 shows a schematic diagram of the PROM memory cell and the flip-flop circuit connected to the output thereof. A plurality of memory cell outputs, a flip-flop FF0 and a transfer gate TG0 are connected to an SRAM data line SD. This flip-flop FF0 constitutes a scan chain. This configuration corresponds to one of the 15 flip-flops F0 shown in FIG. 2. The transfer gate TG also corresponds to one of the 15 transfer gates T0 shown in FIG. 2. First, data to be written into the SRAM by pseudo trimming are input to the flip-flop FF0 by scanning-in.

In this event, when a signal line TGSW is brought into high level so as to turn on the transfer gate TG0, the output of the flip-flop FF0 is supplied to the SRAM data line SD. In this state, the signal line RW is brought into high level and the signal line SWW_N is brought into low level so as to turn on the transfer gate TG2 and turn off the tristate inverter V1. Thus, the level of the SRAM data line SD is held in the node VS. To read the data held in the SRAM portion SRM, the transfer gate TG2 is turned on while the transfer gate TG0 is turned off.

When pseudo trimming based on writing in the SRAM can be performed, information similar to information which would be obtained if the fuse were destroyed can be obtained without destroying the fuse actually. Thus, after the effect of trimming obtained by writing in the PROMs is confirmed, writing into the PROMs can be performed in a lump based on the information.

Figure 8:
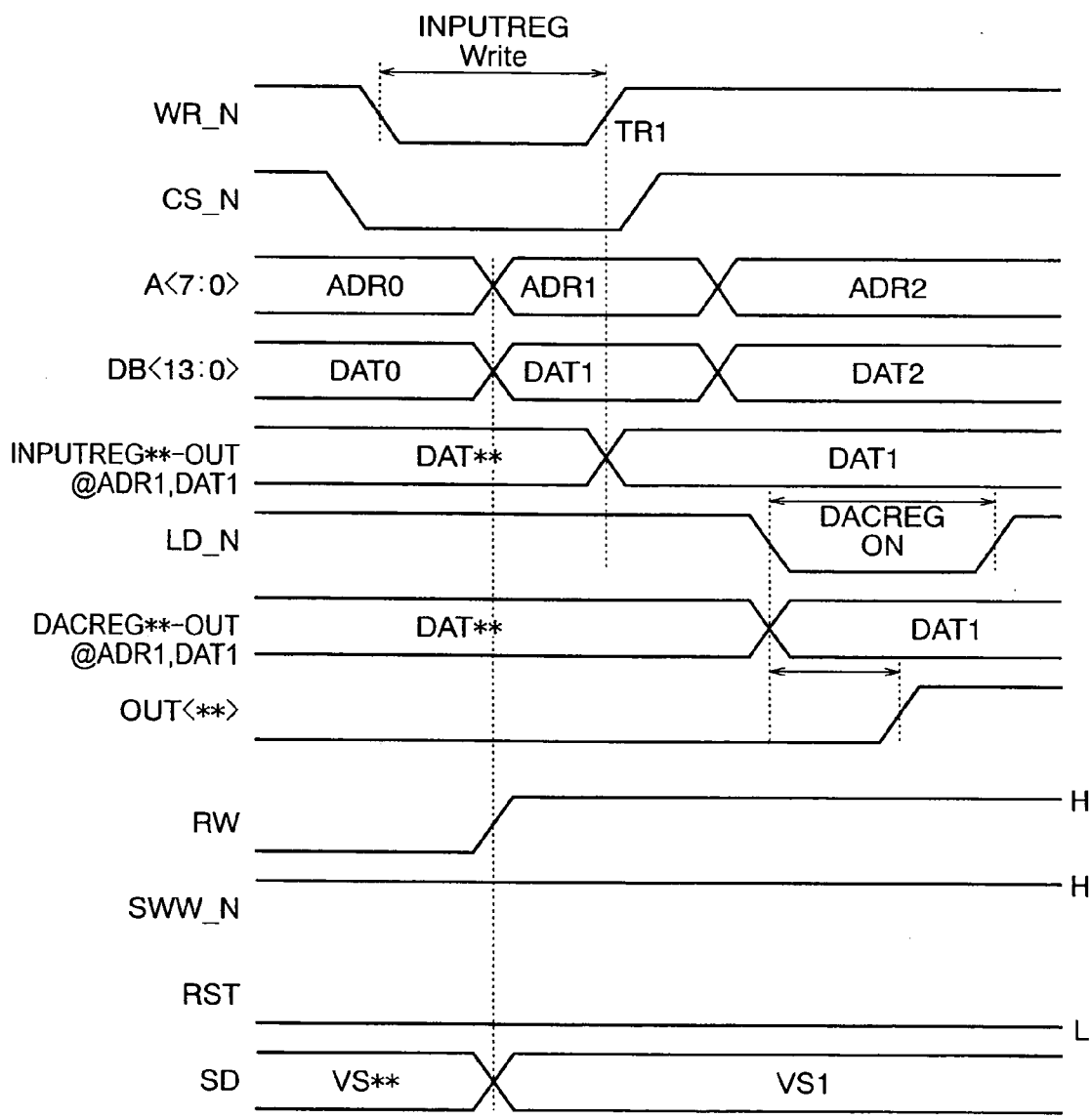
FIG. 8 is a timing chart during normal operation.

FIG. 8 is a timing chart in a normal operation. When a clock pulse as shown in FIG. 7 is input to the input clock WR_N in the state where the chip select CS_N has been brought into low level, data bits to set DAT1 in the data bit input DB<13:0> are written into the input register INPUTREG (shown in FIG. 1) of the channel selected by the address ADR1 input to the address input A<7:0> in the rising edge TR1 of the clock. In this event, the load DAC signal LD_N remains in high level. Therefore, this data bit setting is not output to the output OUT. When LD_N is brought into low level, data are written into the DAC register DACREG (shown in FIG. 1), and the output value of OUT is changed. The operation of the PROM memory cell selected by the address ADR1 and the data bits DAT1 is an SRAM read operation, in which the SRAM write signal SWW_N and the reset signal RST remain in high level and low level respectively, while the SRAM read signal RW is brought into high level at the timing of the address selection, so that the holding voltage VS1 of the selected SRAM is output to the SRAM data line SD.

Figure 9:
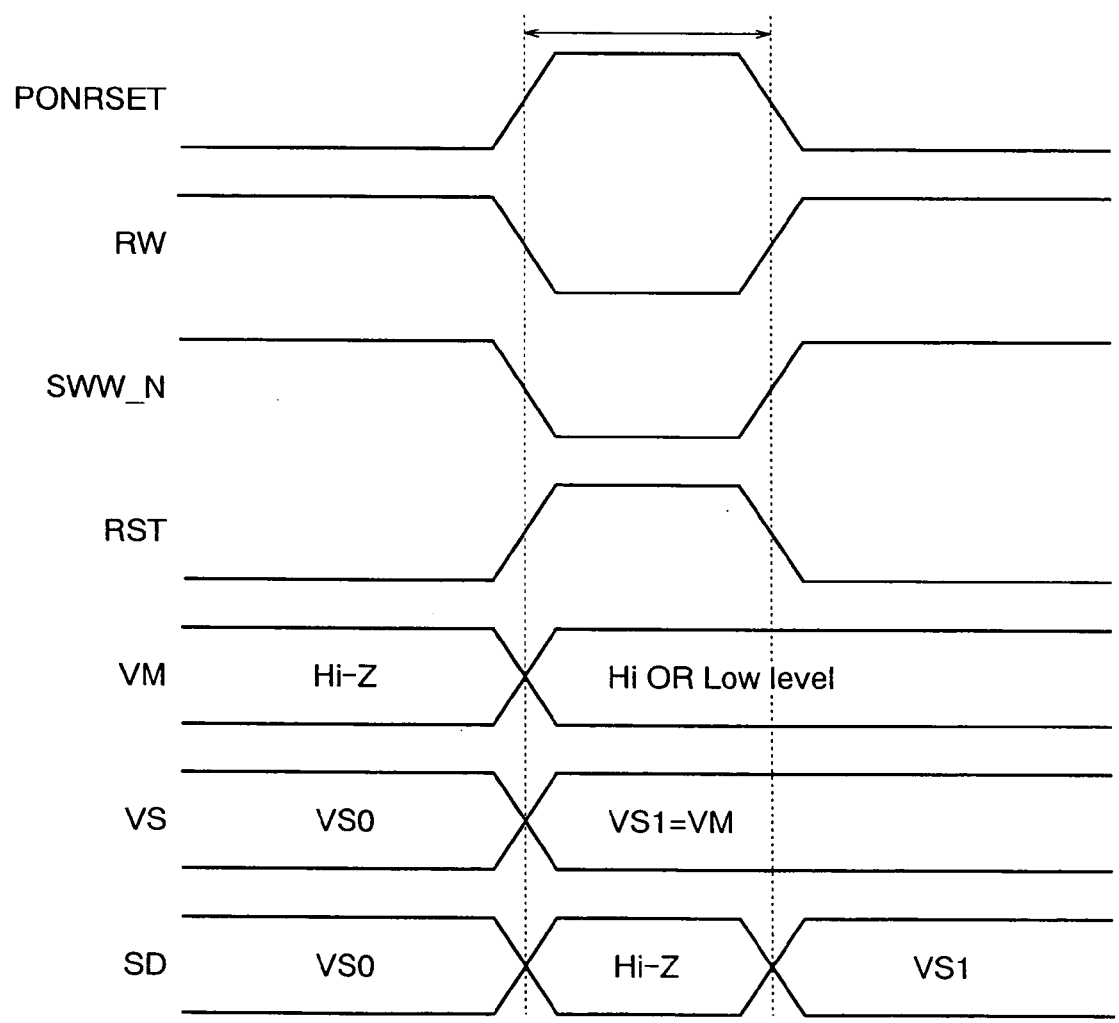
FIG. 9 is a timing chart during scan-in operation.

FIG. 9 is a timing chart of the reset operation at the time of power-on. When a pulse is applied to the PONRSET signal shown in FIG. 3, the SRAM read signal RW and the SRAM write signal are brought into low level and the reset signal RST is brought into high level in each PROM memory cell. In this event, the level of the output node VM of the PROM portion is fetched and held in the SRAM internal node VS.

Figure 10:
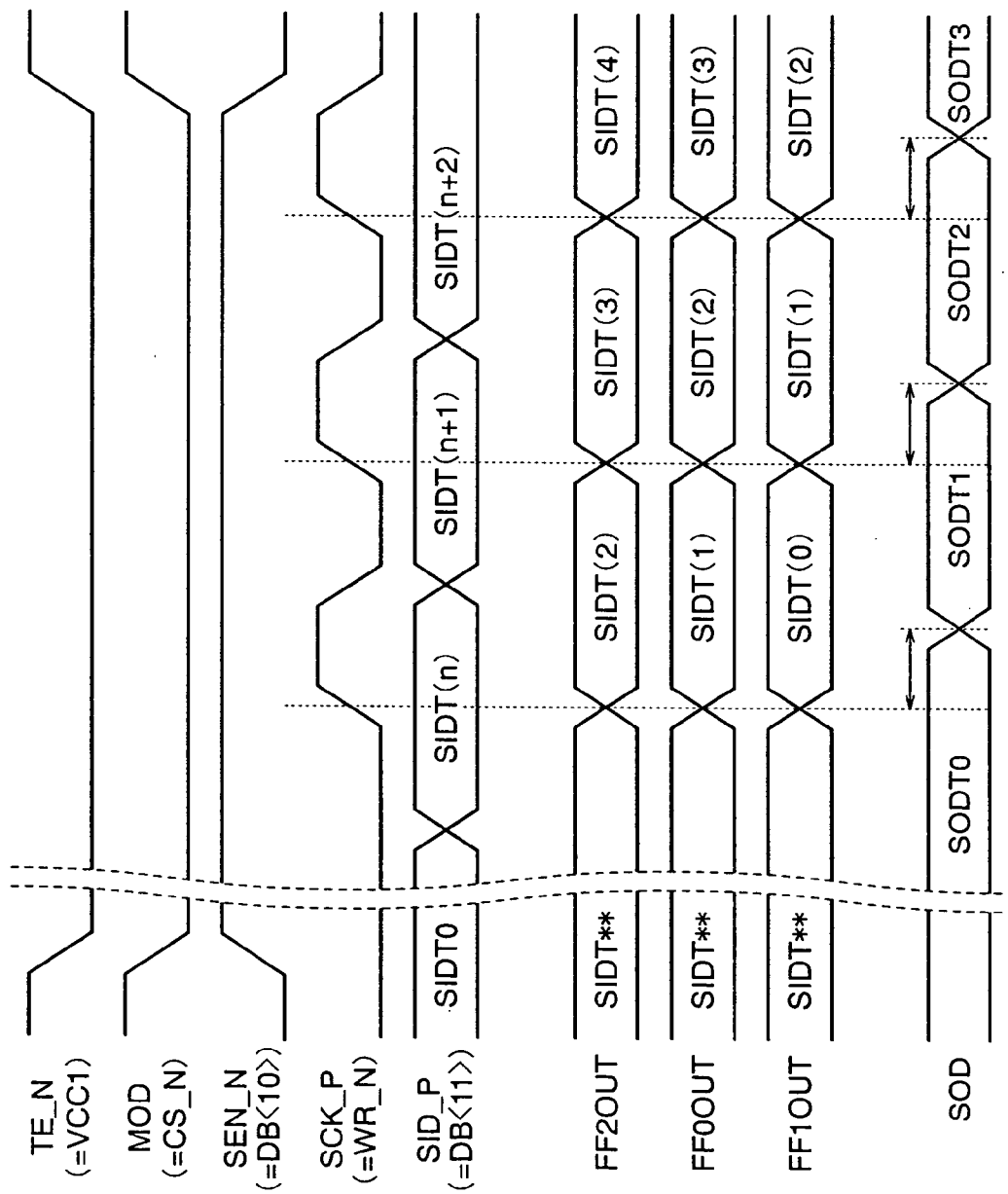
FIG. 10 is a timing chart during SRAM write operation.
Figure 11:
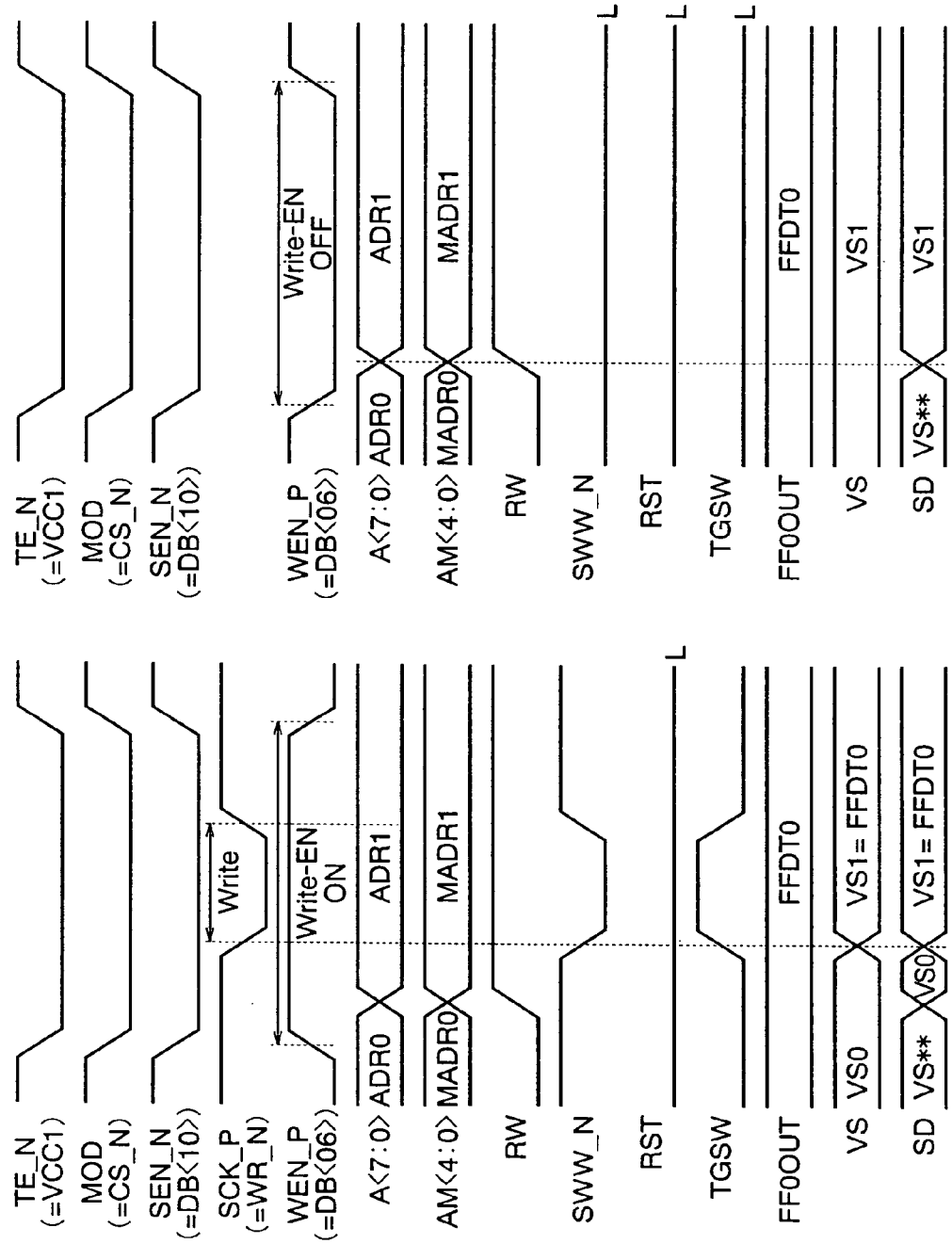
FIGS. 11A and 11B are timing charts during SRAM read operation.
Figure 12:
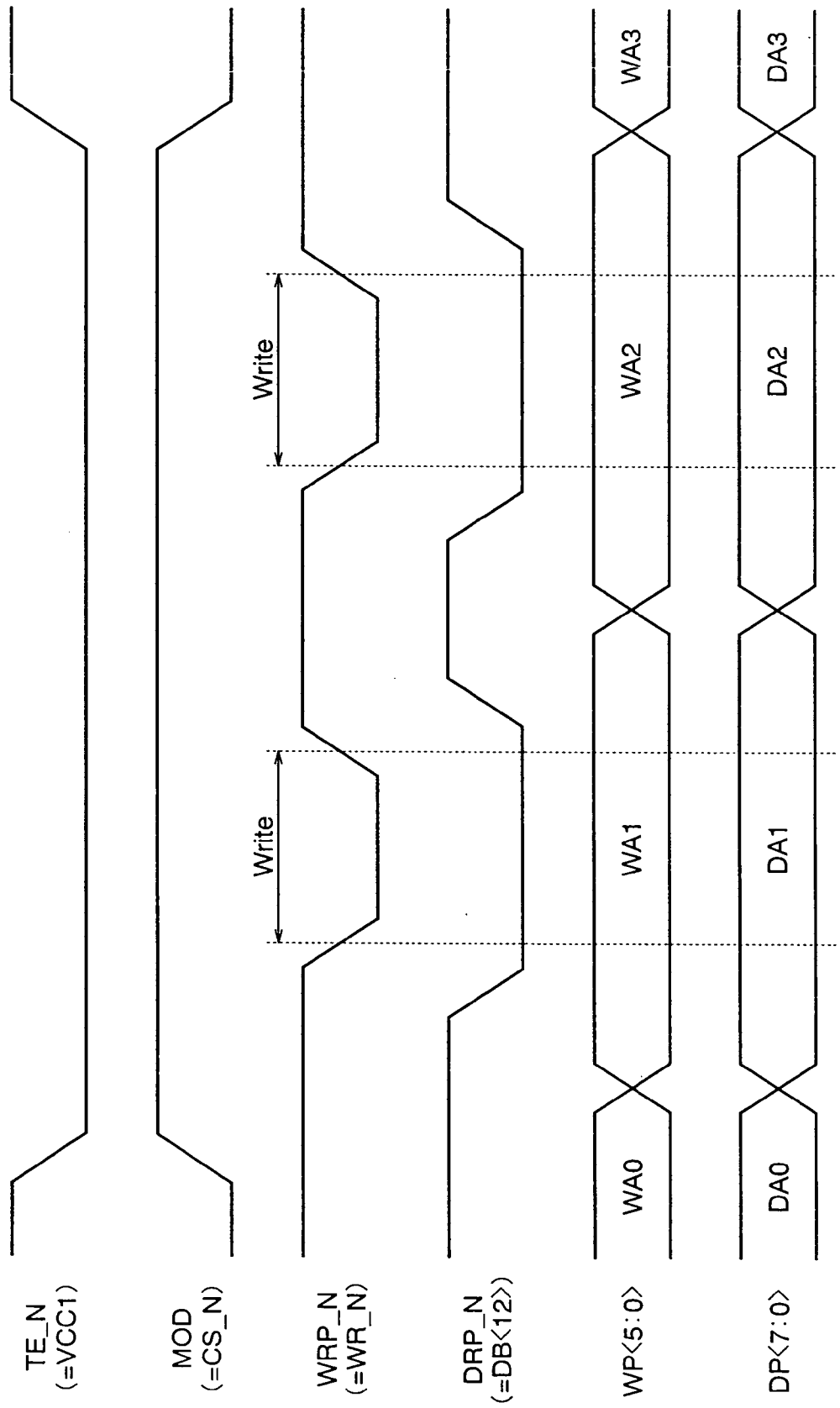
FIG. 12 is a timing chart during PROM write operation.

FIG. 10 is a timing chart in the scanning-in operation. Similarly, FIGS. 11A and 11B are timing charts in the SRAM write operation and the SRAM read operation respectively, and FIG. 12 is a timing chart in the PROM write operation. A diagnostic mode pin TE_N is brought into low level among FIGS. 10-12. One of pins for the analog power supply VCC is assigned to the diagnostic mode pin TE_N. Accordingly, the diagnostic mode pin TE_N is always set in the power supply voltage in the normal service conditions, so that the diagnostic mode is not set. Only to perform diagnostic operations such as various tests, pseudo trimming, writing into PROMs, etc., this pin TE_N is set in low level so as to change the roles of various input pins into diagnostic-mode ones. Thus, various diagnostic operations can be performed without increasing the number of pins.

In the scan operation of FIG. 10, a pin MOD for selecting an SRAM mode or a PROM mode is set at low level together with TE_N, so as to establish the SRAM mode. Further, a scan enable pin SEN_N is set at low level so as to establish a scan operation mode. In this event, data to be scanned in are input from the scan data input pin SID_P, and a clock pulse is input to the clock input SCK_P. Thus, the scan-in operation is initiated. Here, FF0OUT to FF2OUT designate outputs of FF0 to FF2 in FIG. 7 respectively. As shown in FIG. 10, pins to be used in the normal operation are used as external input pins respectively. For example, the pin DB<10> is used as the scan enable pin SEN_N.

In the SRAM write operation of FIG. 11A, MOD is set at low level so as to establish the SRAM mode, and the scan enable pin SEN_N is set at low level. Here, an SRAM write enable signal WEN_MAT<4:0> for each mat as shown in FIG. 3 is generated from the SRAM write enable pin WEN_P and a mat selection signal AM<4:0>. As a result, the SRAM of the selected mat is brought into a write operation mode. In this event, when a clock pulse is input to the clock input SCK_P, input data FFDT0 of the FF0 output FF0OUT are scanned and written into the SRAM internal node VS of the channel selected by the setting ADR1 of the address pin A<7:0> and the data bit setting.

In the SRAM read operation of FIG. 11B, the SRAM write enable pin WEN_P is set at low level in the settings similar to those of FIG. 11A. When the setting ADR1 of the address pin A<7:0> and the data bit setting are reflected in this state, the holding voltage VS1 of the internal node VS of the selected SRAM is output to the SRAM data line SD.

In the PROM write operation of FIG. 12, MOD is set at high level so as to establish a PROM mode. In this event, an address is selected by the PROM word line selection signal WP<5:0> and the PROM data line selection signal DP<7:0>, and both the PROM data line driver driving signal DRP_N and the PROM word line driver driving signal WRP_N are brought into low level. Thus, the PROM data line driver DD and the PROM word line driver WD are turned on together so that the PROM write operation is initiated. As described above, the pins of the address input A<7:0> and the data bit input DB<13:0> are partially assigned to WP<5:0> and DP<7:0> as described previously.

Figure 13:
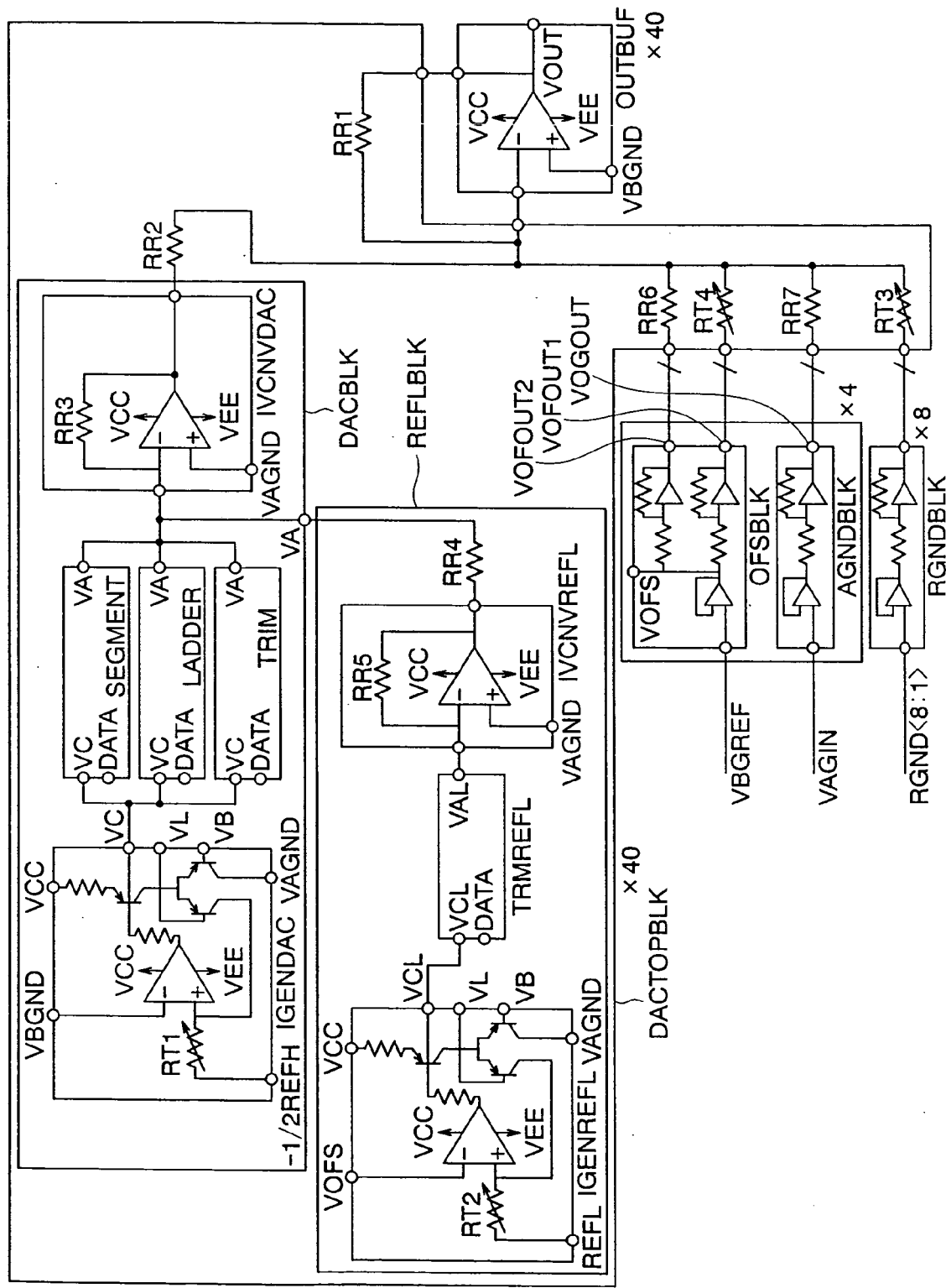
FIG. 13 is a block diagram showing a D/A conversion portion, an output buffer portion and a part of accompanying circuits in FIG. 1.

FIG. 13 is a block diagram showing a D/A conversion portion DAC, an output buffer portion OUTBUF and parts of accompanying circuits in FIG. 1. A D/A conversion portion DACTOPBLK corresponds to the D/A conversion portion DAC of FIG. 1. The D/A conversion portion DACTOPBLK is a block for generating an analog voltage corresponding to the data bit input DB<13:0>. An output buffer portion OUTBUF is an output buffer block corresponding to the output buffer portion OUTBUF of FIG. 1. A gain generation portion DACBLK is a block for receiving particularly the data bit input DB<13:0> and trimming data output with the input as an address, that is, input signals designated by DB_SEGMENT, DB_R2R and DB TRM in FIG. 2, and converting the input signals into an analog voltage. The gain of the analog voltage value output by the analog conversion, that is, the difference between the voltage value when all the bits of the data bit input DB<13:0> are in high level and the voltage value when all the bits of the data bit input DB<13:0> are in low level is determined by a positive reference voltage REFH input externally. The gain generation portion DACBLK is constituted by a constant current generation circuit IGENDAC, a segment D/A conversion portion SEGMENT, an R2R D/A conversion portion LADDER, a trimming portion TRIM, and a current-voltage conversion circuit IVCNVDAC. In the constant current generation circuit IGENDAC, a reference current is generated from the reference voltage REFH, and a reference base voltage VC of a current source is generated. The segment D/A conversion portion SEGMENT, the R2R D/A conversion portion LADDER and the trimming portion TRIM receive the reference base voltage VC and generate a current corresponding to the data bit input DB<13:0>. Trimming data corresponding to the input data DB<13:0> are input to the trimming portion TRIM from the memory mats MAT0, MAT1 and MAT2 of the aforementioned PROM memory cell block PROMBLK. The current generated thus is output to a signal line VA, and converted into a voltage again by the current-voltage conversion circuit IVCNVDAC. Thus, the voltage is output.

An offset generation portion REFLBLK is a block for receiving a negative reference voltage REFL input externally, and generating an offset voltage, that is, a voltage value for shifting the output voltage to the negative side. The offset generation portion REFLBLK is constituted by a constant current generation circuit IGENREFL, a trimming portion TRIMREFL, and a current-voltage conversion circuit IVCNVREFL. Trimming data are input to the trimming portion TRIMREFL from the memory mats MAT3 and MAT4 of the PROM memory cell block PROMBLK. In the constant current generation circuit IGENREFL, a reference current is generated from a reference voltage REFL and a reference voltage VOFS, and a reference base voltage VCL of a current source is generated. The reference voltage VOFS is a reference voltage generated from a power supply voltage internally in the LSI. The trimming portion TRIM-REFL receives the reference base voltage VCL, adds a trimming part to the reference current and outputs the current to a signal line VA. This current is converted into a voltage again and output by the current-voltage conversion circuit IVCNVREFL. This output voltage is further converted into a current by a resistor RR4, and input to the node VA of the gain generation portion DACBLK so as to provide an offset voltage.

The value of the analog voltage output through the offset generation portion REFLBLK and the gain generation portion DACBLK is amplified by resistors RR2 and RR1, and output as an output voltage VOUT of the output buffer portion OUTBUF.

An offset correction circuit OFSBLK is constituted by a voltage follower circuit using an operational amplifier, and an inverting amplification circuit. The offset correction circuit OFSBLK is a circuit for correcting the voltage value by trimming when the zero-point voltage, that is, the output voltage VOUT when all the bits of the data bit input DB<13:0> are in low level is shifted from 0 V. A reference voltage VBGREF is a reference voltage generated from the power supply voltage internally in the LSI, similarly to the reference voltage VOFS. The offset correction circuit OFSBLK is mounted by a ratio of one to ten channels in the LSI according to the embodiment. The trimming is performed by adjusting the value of a resistor RT4 prepared for each channel.

Figure 14:
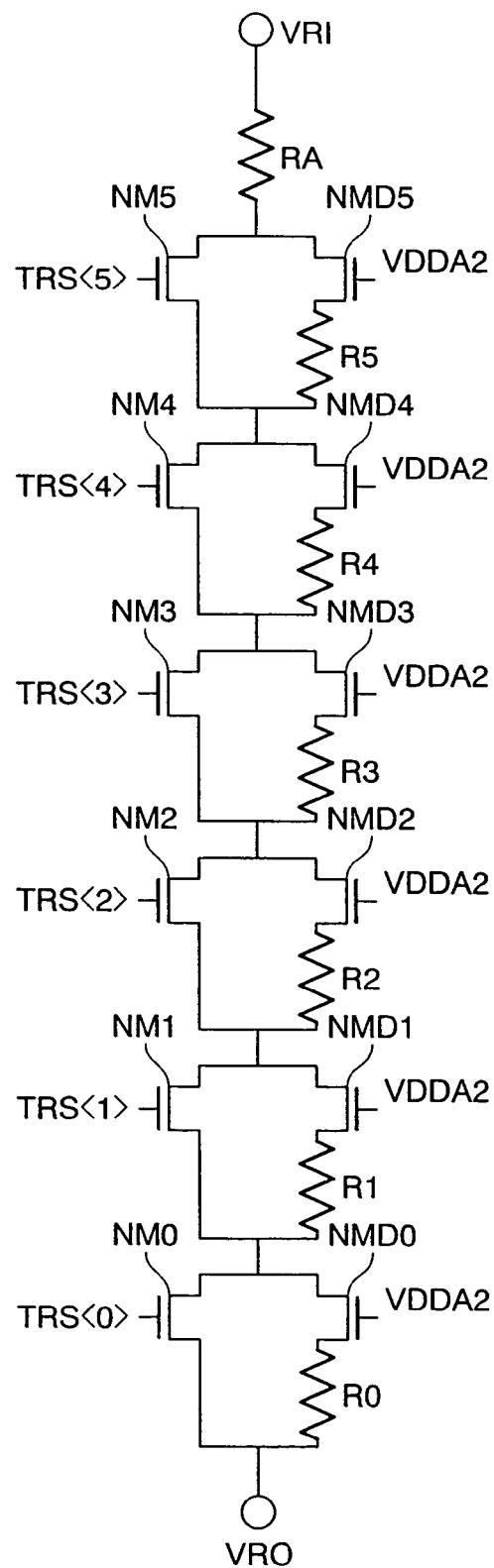
FIG. 14 is a configuration diagram showing a resistor RT4 in FIG. 13 in detail.

FIG. 14 shows the configuration of the resistor RT4. A resistor RA has a principal resistance value. A resistor R0 has a resistance value serving as a minimum unit to trim. A resistor R1 has resistance value twice as high as that of the resistor R0. A resistor R2 has resistance value twice as high as that of the resistor R1. A resistor R3 has resistance value twice as high as that of the resistor R2. A resistor R4 has resistance value twice as high as that of the resistor R3. A resistor R5 has resistance value twice as high as that of the resistor R4. Here, VDDA2 designates an analog power supply voltage generated internally for analog, and NMOS transistors NMD0 to NMD5 are always turned on. For example, when all the trimming signals TRS<0> to TRS<5> are in high level, the resistance between a node VRI and a node VR0 is the total sum of the resistance of the resistor RA and on-resistances of NMOS transistors NM0 to NM5. Here, when the trimming signal TRS<0> is in low level, the resistor R0 cannot be bypassed. If the on-resistances of NM0 to NM5 are equal to those of NMD0 to NMD5, the resistance will increase by R0. When the trimming signals TRS<0> to TRS<5> are changed thus, it is possible to add a resistance up to about 63 times as high as the resistor R0. In such a manner, the resistance between VRI and VR0 is adjusted to perform correction. Not to say, the data output from the memory mats MAT3 and MAT4 of the PROM memory block PROMBLK are used in the trimming signals TRS<1> to TRS<5>.

The resistors RT1 to RT3 have configurations similar to that of the resistor RT4. Each resistor RT1-3 can be trimmed.

An AGND correction circuit AGNDBLK is also constituted by a voltage follower circuit using an operational amplifier, and an inverting amplification circuit, and mounted by a ratio of one to ten channels. An analog ground voltage VAGND at a certain place is input to this circuit as an input VAGIN, and an inverted voltage thereof is output to an output VAGOUT.

In the LSI according to the embodiment, the analog ground is divided into two kinds VAGND and VBGND. The ground VBGND is a reference voltage ground to which currents are rarely applied. The ground VAGND is a ground to which a large current is applied. Therefore, a slight power supply drop occurs in the ground VAGND in principle so that there occurs a difference in VAGND level among channels. It is next to unnecessary to take a power supply drop in the ground VBGND into consideration because currents are rarely applied thereto. Here, if the AGND correction circuit is not mounted, this difference in level will appear as a fluctuation of the output voltage as it is. Therefore, the AGND correction circuit is mounted for every 10 channels having a small difference in power supply drop among the channels. The drop of the ground VAGND is fed back to largely reduce the fluctuation of the output voltage caused by the power supply drop in the ground VAGND. The ground VBGND having little voltage fluctuation is used as a reference voltage for the output driver portion of the final stage. Thus, the accuracy of the output voltage is further improved.

Figure 15:
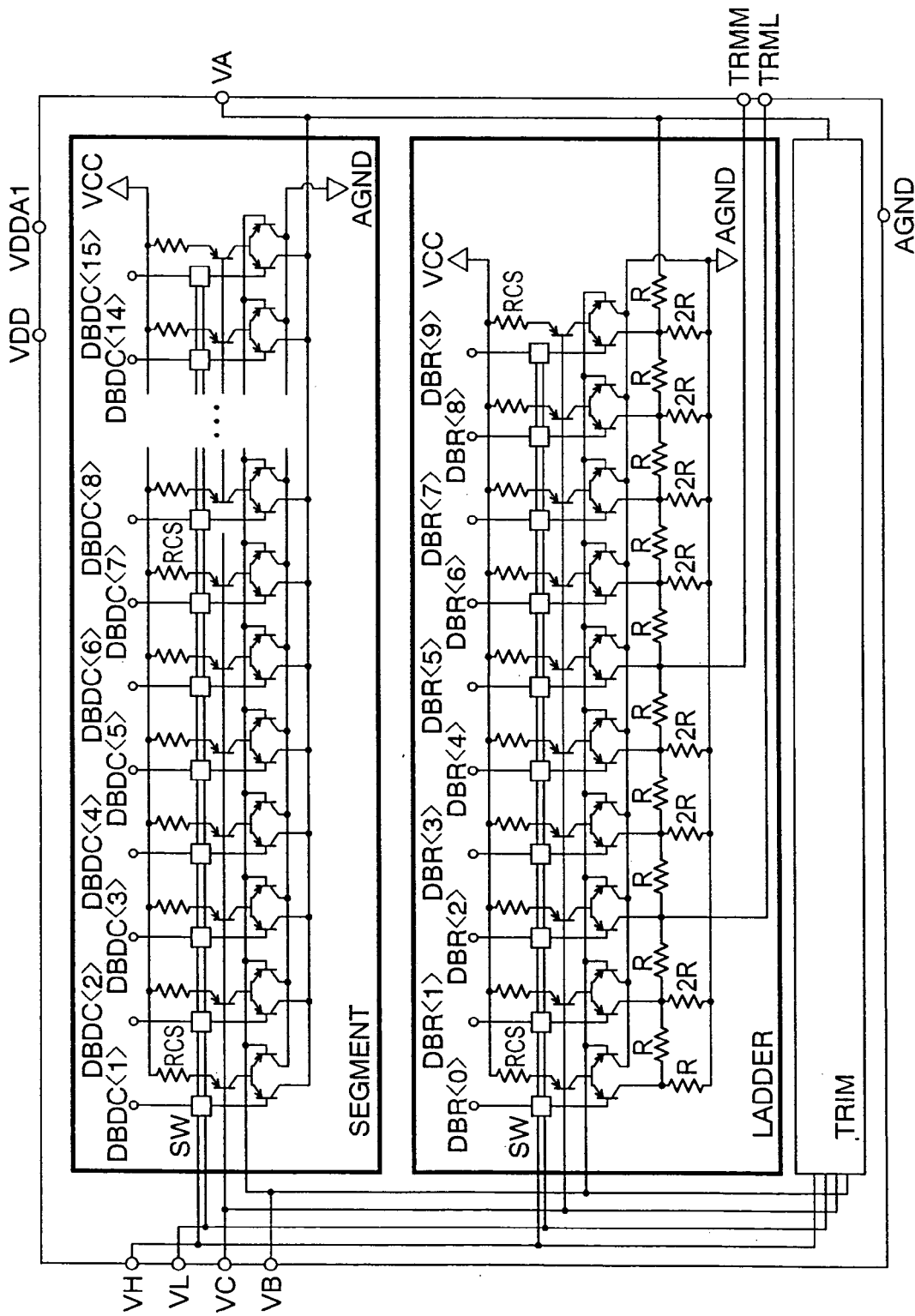
FIG. 15 is a circuit diagram showing the block of a segment D/A conversion portion and an R2R D/A conversion portion in FIG. 14 in detail.

FIG. 15 is a circuit diagram showing the details of the block of the segment D/A conversion portion SEGMENT and the R2R D/A conversion portion LADDER in FIG. 13. Fifteen current source circuits for applying a current flow determined by the constant current generation circuit IGEN-DAC in FIG. 13 are connected to the segment D/A conversion portion SEGMENT. As soon as bit signals of an input signal DBDC<15:0> from a digital power supply system are turned on, the bit signals are converted into analog voltages through voltage conversion circuits SW so as to turn on the corresponding current source circuits. Thus, a current corresponding to the number of the current source circuits is applied to the signal line VA. The input signal DBDC<15:0> is a signal for providing upper data bits corresponding to DBDC<15:0> in FIG. 2. Each voltage conversion circuit SW, which will be described in detail later, serves to selectively output an analog voltage VL or VH in accordance with a digital signal input to the voltage conversion circuit SW, so that the voltage conversion circuit SW turns on its corresponding current source circuit when outputting the analog voltage VH and turns off the current source circuit when outputting the analog voltage VL. VL designates a voltage one-diode lower than a reference voltage VB, and VH designates a voltage one-diode higher than the reference voltage VB. Each voltage VL, VB, VH is generated from the power supply voltage internally in the LSI.

On the other hand, the R2R D/A conversion portion LADDER, to which 10 current source circuits are connected in the same manner, varies a current flow in accordance with an input signal DBR<10:0>. This circuit forms an R2R ladder circuit. This circuit is constituted by the combination of resistors R each having a resistance value R, resistors 2R each having a resistance value 2R, and current sources. Assume that the current flow when one bit is turned on in the segment D/A conversion portion SEGMENT is ISEG. When a DBR<9> is turned on, a current ½ as high as ISEG is added to the signal line VA. When a DBR<8> is turned on, a current ¼ as high as ISEG is added to the signal line VA. When a DBR<0> is turned on, a current $1/1024$ as high as ISEG is added to the signal line VA. The input signal DBR<10:0> is a signal for providing lower data bits corresponding to DBR<10:0> in FIG. 2. According to a simple principle, 14-bit D/A conversion can be performed only by the circuit shown in FIG. 15. In fact, however, correction by trimming is inevitable due to manufacturing variations in properties of bipolar transistors of the current sources and resistors.

Figure 16:
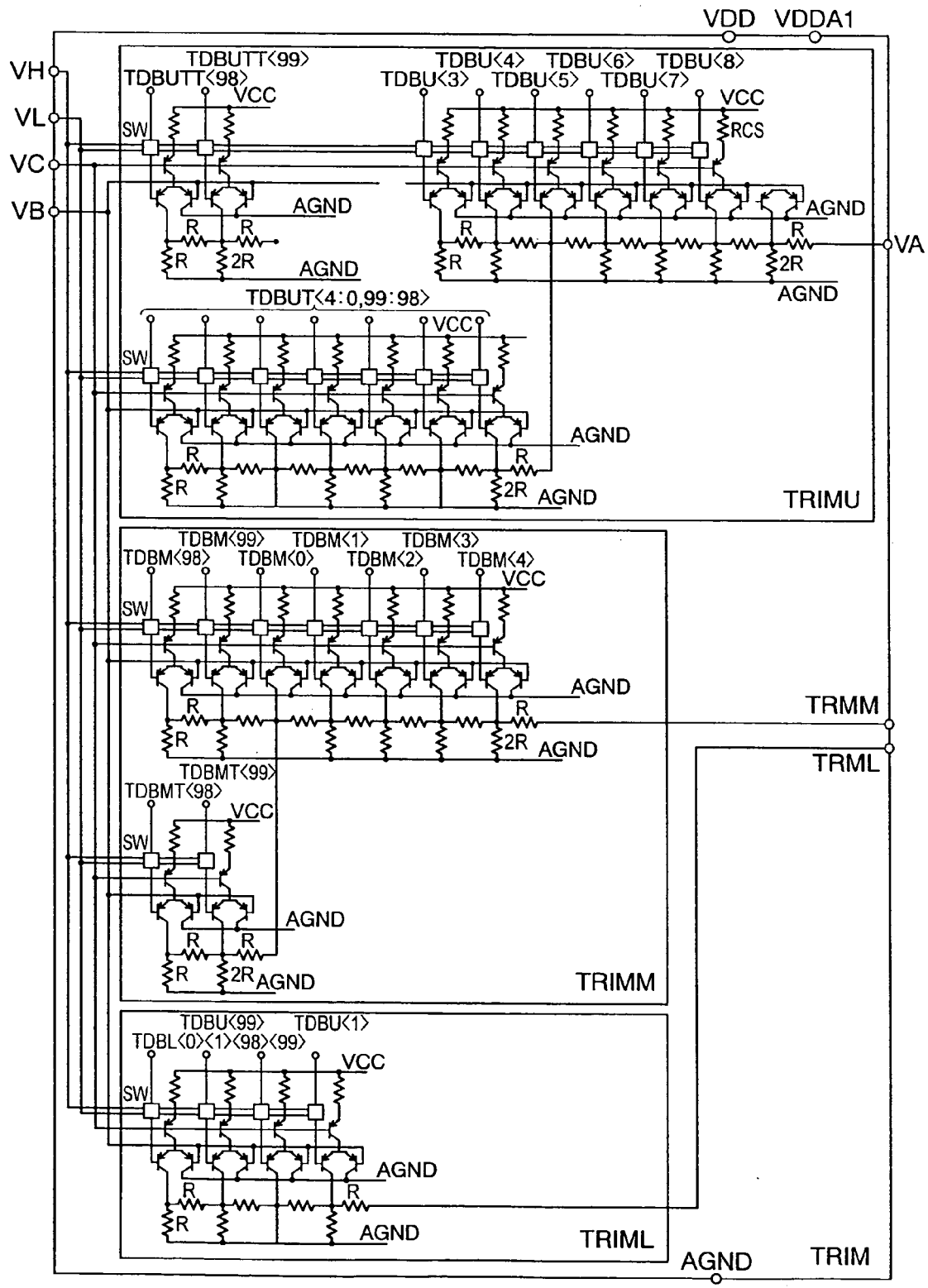
FIG. 16 is a circuit diagram showing the block of a trimming portion in FIG. 14 in detail.

FIG. 16 is a circuit diagram showing the block of the trimming portion TRIM in detail. 15-bit, 9-bit and 4-bit signals output from the PROM mats MAT0, MAT1 and MAT2 in FIG. 2 respectively correspond to inputs of an upper bit trimming circuit TRIMU, a middle bit trimming circuit TRIMM and a lower bit trimming circuit TRIML in FIG. 16 respectively. Each trimming circuit portion has the same R2R ladder circuit configuration as the R2R D/A conversion portion LADDER in FIG. 15. The output of the upper bit trimming circuit TRIMU is connected to the signal line VA in the same manner as the segment D/A conversion portion SEGMENT and the R2R D/A conversion portion LADDER in FIG. 15. On the other hand, the outputs of the middle bit trimming circuit TRIMM and the lower bit trimming circuit TRIML are connected to nodes TRMM and TRML halfway in the R2R ladder portion of the R2R D/A conversion portion LADDER shown in FIG. 15, respectively. With this configuration, the trimming circuits TRIMM and TRIML act as resistors each having a resistance value 2R in view from the nodes TRMM and TRML, respectively. Accordingly, the trimming circuits TRIMM and TRIML have no influence on the operation of the R2R D/A conversion portion LADDER as an R2R ladder circuit. When the configuration in which R2R ladder circuits are branched from nodes halfway in another R2R ladder circuit is used thus, the number of required resistors can be reduced so that the chip area can be saved.

Figure 17:
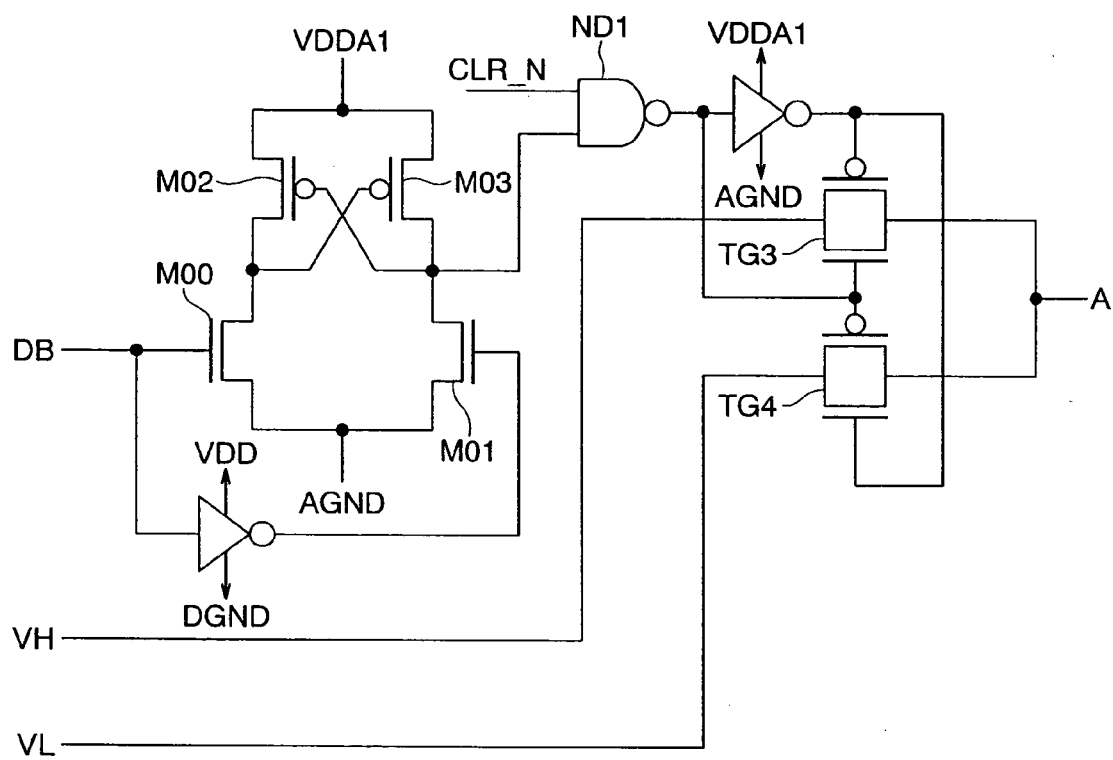
FIG. 17 is a circuit diagram of a voltage conversion circuit in FIGS. 15 and 16.
Figure 18:
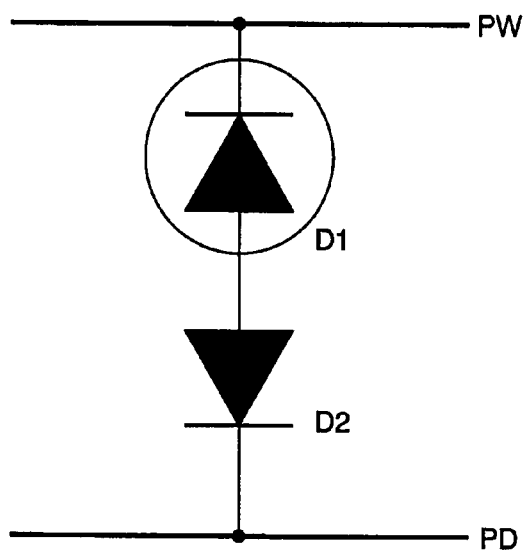
FIG. 18 is a configuration diagram of a background-art anti-fuse using diode transistors.

FIG. 17 is a circuit diagram of the portion shown by the voltage conversion circuit SW in FIGS. 15 and 16. An input signal DB and an inverter V3 operate in a digital power supply system, that is, a VDD-DGND system. On the other hand, CMOS transistors M00 to M03 operate in a system of an analog power supply VDDA1 generated internally in the LSI, and the analog ground AGND. Digital signals are converted into the analog power supply system by this circuit. Transfer gates TG3 and TG4 also operate in the analog power supply system, so as to selectively output an analog voltage VL or VH to the output A in accordance with the digital input signal DB. A typical voltage conversion circuit generally has a configuration in which a constant current is applied. With the circuit configuration according to this embodiment, however, voltage conversion without consuming any constant current can be performed. Particularly when a number of such voltage conversion circuits are provided as in the LSI according to the embodiment, this configuration is very effective in reduction of power consumption.

In this embodiment, it is desired that the absolute value of the resistance of each resistance component in FIGS. 13 to 16 can be trimmed, but the temperature coefficient thereof is as small as possible. The embodiment is therefore characterized in that TaN (tantalum nitride) having a small temperature coefficient is used as the material of resistance. SiCr or NiCr available as similar material is a material which has not been used in background-art semiconductor front-end lines. There is a fear of contamination or the like in those materials. On the other hand, TaN is a time-proven material because it has been used as barrier metal of Cu wiring or the like. Therefore, TaN can improve reliability. TaN shows a special effect when it is applied not only to this embodiment but also to an analog circuit such as a D/A converter.

Figure 20:
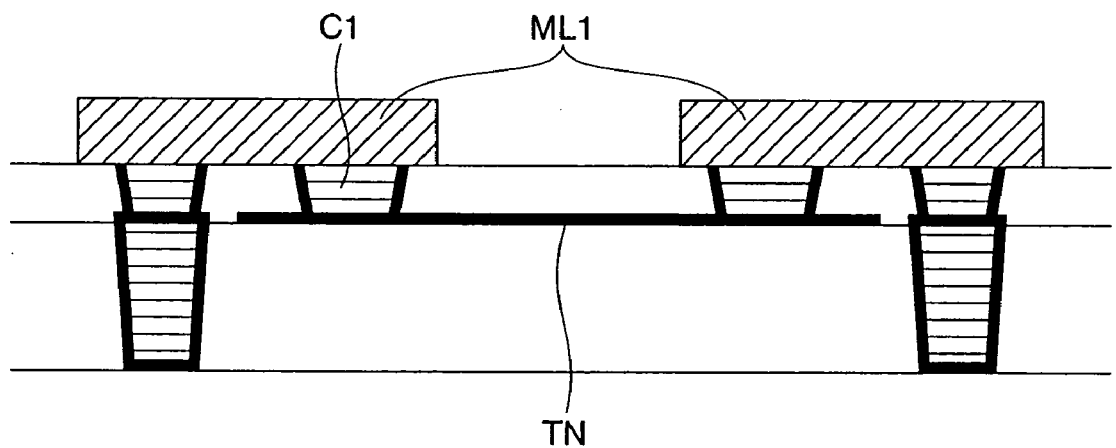
FIG. 20 is a sectional view showing the case where a TaN resistor is formed under a first layer of wiring.
Figure 21:
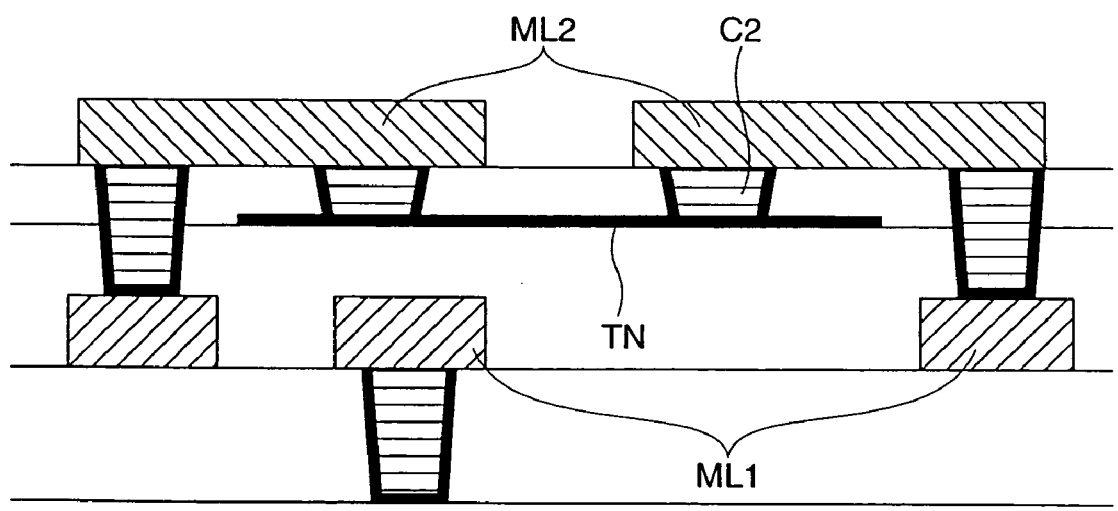
FIG. 21 is a sectional view showing the case where a TaN resistor is formed above a first layer of wiring.
Figure 22:
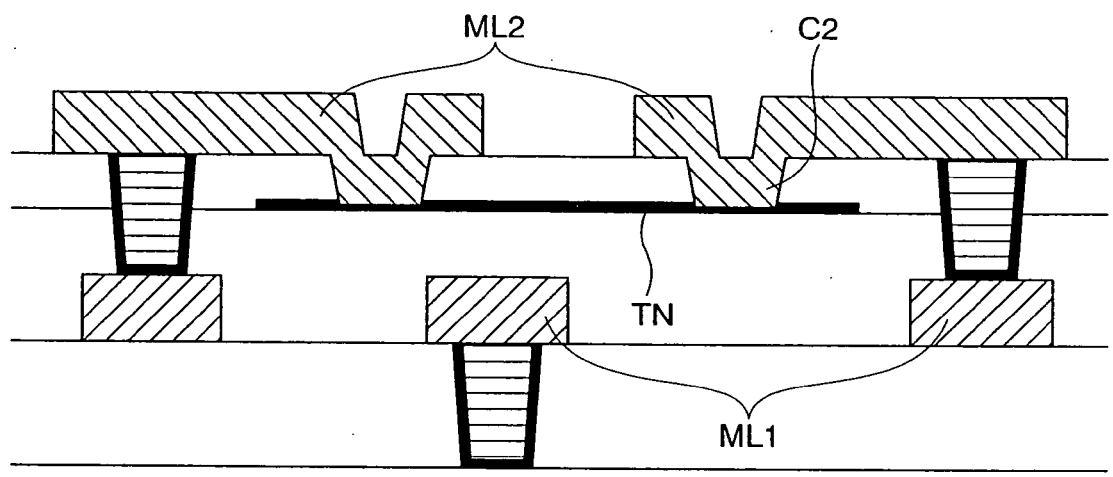
FIG. 22 is a sectional view showing the case where a TaN resistor is formed above a first layer of wiring.
Figure 23:
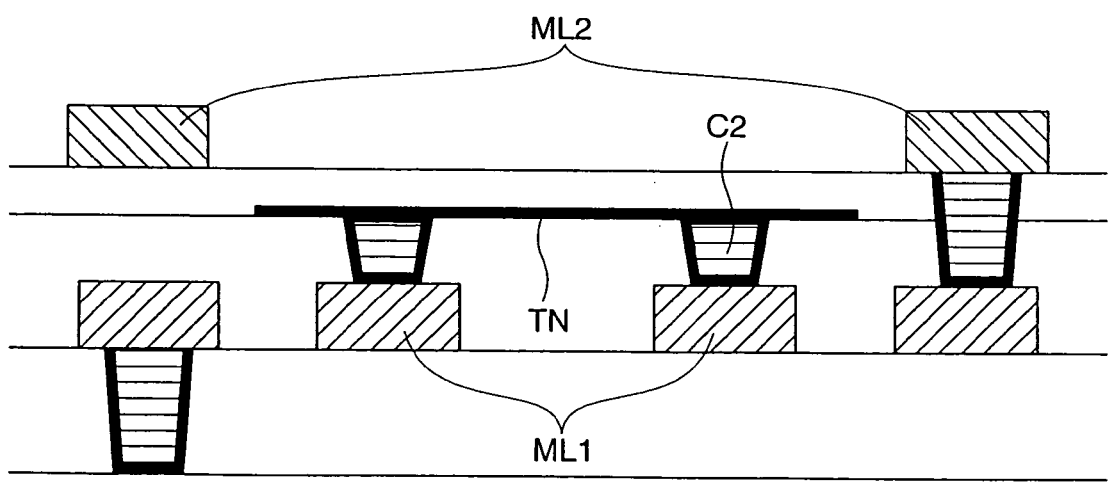
FIG. 23 is a sectional view showing the case where a TaN resistor is formed above a first layer of wiring.

FIGS. 20-23 show examples in which TaN is used for resistors. TaN can be used in an initial layer of wiring so that the layout can be designed easily. FIG. 20 shows an example in which TaN is provided as a layer under a first layer ML1 of wiring. On the other hand, FIGS. 21, 22 and 23 show examples in which TaN is provided between a first layer ML1 and a second layer ML2 of wiring.

In FIG. 20, a contact C1 of a resistor TN is taken from above the resistor.

In FIG. 21, a contact C2 of a resistor TN is taken from above the resistor. The contact of the resistor TN is drawn in a plug system.

In FIG. 22, a contact C2 of a resistor TN is taken from above the resistor. The contact of the resistor TN is drawn in a second layer ML2 of wiring.

In FIG. 23, a contact C2 of a resistor TN is taken from below the resistor.

Although the embodiment has been described above with reference to the drawings, the present invention is not limited to the embodiment, but various changes can be made on the invention without departing the scope and spirit thereof. For example, PROM memory cells may be used not only for DAC trimming data but also for another information to be stored in non-volatility.

The invention claimed is:

1. A semiconductor device comprising:
a memory mat including a plurality of first memory cells; and
a plurality of output lines connected to the plurality of first memory cells; wherein:
each of the plurality of memory cells has a first memory portion including bipolar transistors and storing information in non-volatility based on whether a junction of the bipolar transistors is destroyed or not, and a second memory portion connected to the first memory portion and for outputting information to corresponding one of the plurality of output lines; and
the semiconductor device has a first mode in which information is transferred from the first memory portions to the second memory portions when the information is written into the second memory portions, and a second mode in which the second memory portions are specified externally and information is written into the second memory portions.

2. A semiconductor device according to claim 1, wherein:
each of the plurality of memory cells further includes a first transfer gate provided between the first memory portion and the second memory portion; and
the first transfer gate transfers information stored in the first memory portion, to the second memory portion when a reset signal is input to the semiconductor device.

3. A semiconductor device according to claim 1, further comprising:
a plurality of flip-flops provided correspondingly to the plurality of output lines; and
a plurality of second transfer gates provided between the plurality of output lines and the plurality of flip-flops respectively; wherein:
the plurality of flip-flops form a scan chain; and
the semiconductor device transfers data to the plurality of flip-flops sequentially in the second mode, and then selects the second transfer gates so as to transfer information to the second memory portions corresponding thereto.

4. A semiconductor device according to claim 1, wherein:
the plurality of memory cells further include third transfer gates provided between the second memory portions and the plurality of output lines respectively.

5. A semiconductor device according to claim 4, wherein:
the memory mat has first word lines to be selected to write information into the first memory portions, and second word lines to be selected to read information from the second memory portions through the third transfer gates.

6. A semiconductor device according to claim 5, wherein:
each first memory portion has a first bipolar transistor whose emitter and base are connected to the corresponding first word line, and a second bipolar transistor whose emitter is connected to a collector of the first bipolar transistor;
a base and a collector of the second bipolar transistor are connected to a first data line; and
a current is applied from the first word line to the first data line when information is written into the first memory portion.

7. A semiconductor device according to claim 6, wherein:
each second memory portion is an SRAM.

8. A semiconductor device according to claim 5, wherein:
the first word lines and the second word lines are selected based on different pieces of information.

9. A semiconductor device according to claim 8, wherein:
the semiconductor device is a digital-analog converter for outputting an analog signal based on input digital data; and
the second word lines are selected based on the input digital data.

* * * * *